United States Patent
Shioda et al.

(10) Patent No.: US 10,438,966 B2
(45) Date of Patent: Oct. 8, 2019

(54) SEMICONDUCTOR DEVICE

(71) Applicant: Toshiba Memory Corporation, Minato-ku (JP)

(72) Inventors: Tomonari Shioda, Yokkaichi (JP); Junya Fujita, Nagoya (JP); Tatsuro Nishimoto, Yokkaichi (JP); Yoshiaki Fukuzumi, Yokkaichi (JP); Atsushi Fukumoto, Mie (JP); Hajime Nagano, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/913,947

(22) Filed: Mar. 7, 2018

(65) Prior Publication Data

US 2019/0067317 A1    Feb. 28, 2019

(30) Foreign Application Priority Data

Aug. 28, 2017   (JP) .................. 2017-163616

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/28282* (2013.01); *H01L 27/11556* (2013.01);
(Continued)

(58) Field of Classification Search
CPC ......... H01L 27/11582; H01L 27/11556; H01L 29/7827; H01L 29/1037; H01L 29/36; H01L 29/1095
See application file for complete search history.

(56) References Cited

U.S. PATENT DOCUMENTS 8,344,385 B2   1/2013 Kim et al.
8,735,230 B2   5/2014 Saino
(Continued)

FOREIGN PATENT DOCUMENTS

| JP | 2008-4594 | 1/2008 |
| JP | 2013-222785 | 10/2013 |
| JP | 2015-149413 | 8/2015 |

OTHER PUBLICATIONS

N. Moriya et al., "Boron Diffusion in Strained Si1-$_x$Ge$_x$ Epitaxial Layers", Physical Review Letters, vol. 71, No. 6, Aug. 9, 1993, 4 pages.

*Primary Examiner* — Jarrett J Stark
(74) *Attorney, Agent, or Firm* — Oblon, McClelland, Maier & Neustadt, L.L.P.

(57) ABSTRACT

According to one embodiment, the silicon layer includes phosphorus. The buried layer is provided on the silicon layer. The stacked body is provided on the buried layer. The stacked body includes a plurality of electrode layers stacked with an insulator interposed. The semiconductor body extends in a stacking direction of the stacked body through the stacked body and through the buried layer, and includes a sidewall portion positioned at a side of the buried layer. The silicon film is provided between the buried layer and the sidewall portion of the semiconductor body. The silicon film includes silicon as a major component and further includes at least one of germanium or carbon.

16 Claims, 23 Drawing Sheets

(51) Int. Cl.
  *H01L 29/78* (2006.01)
  *H01L 29/10* (2006.01)
  *H01L 29/36* (2006.01)
  *H01L 21/28* (2006.01)
  *H01L 27/11565* (2017.01)
  *H01L 51/52* (2006.01)

(52) U.S. Cl.
  CPC .... *H01L 27/11565* (2013.01); *H01L 29/1037* (2013.01); *H01L 29/1095* (2013.01); *H01L 29/36* (2013.01); *H01L 29/7827* (2013.01); *H01L 51/5259* (2013.01)

(56) References Cited

U.S. PATENT DOCUMENTS

| | | |
|---|---|---|
| 8,969,946 B2 | 3/2015 | Jhang et al. |
| 9,171,948 B2 | 10/2015 | Mori |
| 9,425,210 B2 * | 8/2016 | Lee ................... H01L 27/11582 |
| 9,431,419 B2 | 8/2016 | Fukuzumi et al. |
| 9,455,263 B2 | 9/2016 | Zhang et al. |
| 9,520,407 B2 * | 12/2016 | Fukuzumi ......... H01L 27/11582 |
| 9,576,969 B2 | 2/2017 | Manorotkul et al. |
| 9,805,805 B1 * | 10/2017 | Zhang ............... H01L 27/11565 |
| 2009/0087577 A1 * | 4/2009 | Russell ............. H01L 21/76825 |
| | | 427/523 |
| 2010/0276743 A1 | 11/2010 | Kuniya et al. |
| 2012/0064682 A1 | 3/2012 | Jang et al. |

* cited by examiner

US 10,438,966 B2

SEMICONDUCTOR DEVICE

CROSS-REFERENCE TO RELATED APPLICATION

This application is based upon and claims the benefit of priority from Japanese Patent Application No. 2017-163616, filed on Aug. 28, 2017; the entire contents of which are incorporated herein by reference.

FIELD

Embodiments described herein relate generally to a semiconductor device.

BACKGROUND

A structure of three-dimensional memory has been proposed in which sidewall portions of channel bodies piercing a stacked body including multiple electrode layers are in contact with a source layer provided under the stacked body. The sidewall portions of the channel bodies contact a semiconductor layer included in the source layer. The semiconductor layer is filled into an air gap formed after removing a sacrificial layer.

DETAILED DESCRIPTION

Figure 1:
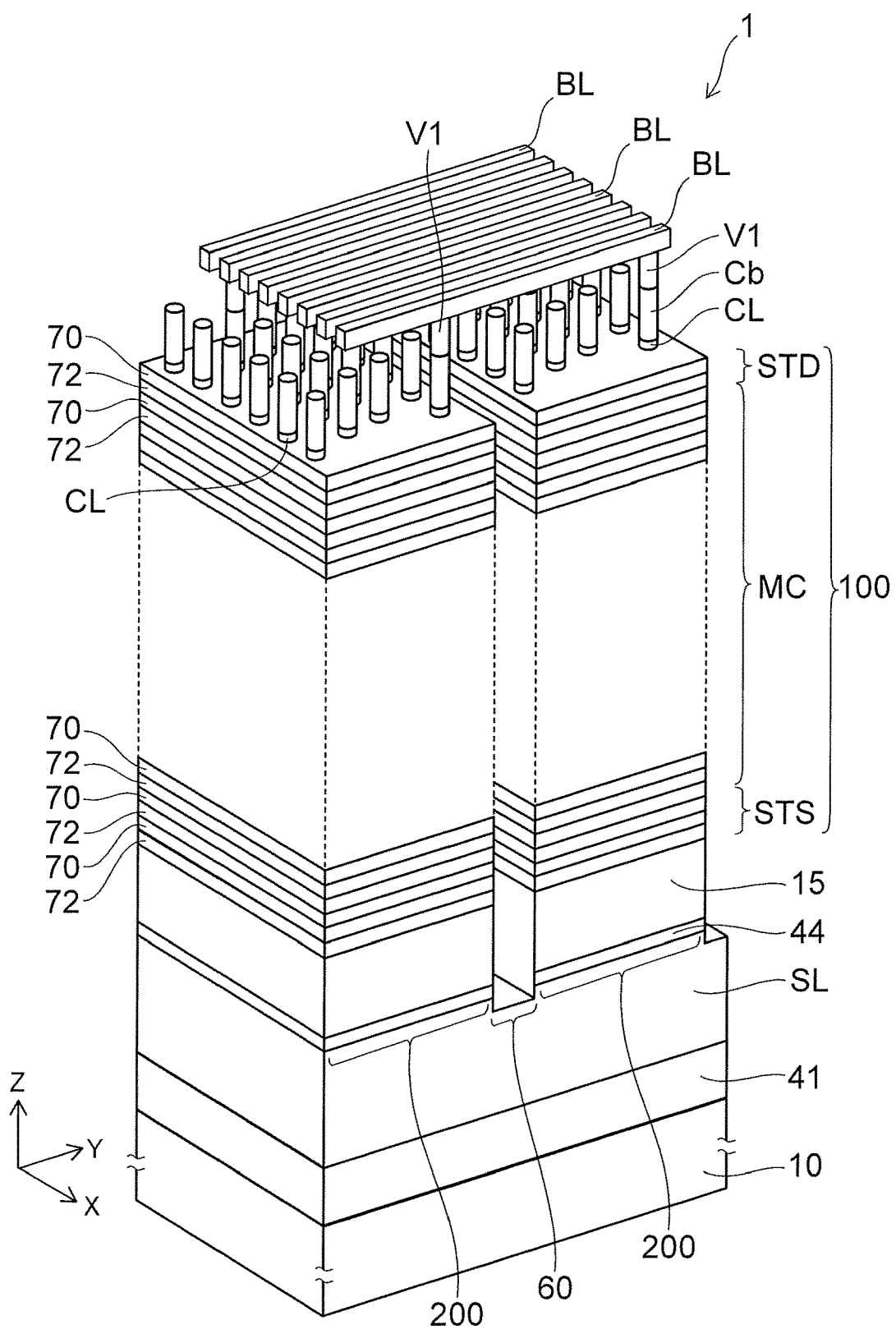
FIG. 1 is a schematic perspective view of a semiconductor device of an embodiment.

According to one embodiment, a semiconductor device includes a silicon layer, a buried layer, a stacked body, a semiconductor body, and a silicon film. The silicon layer includes phosphorus. The buried layer is provided on the silicon layer. The stacked body is provided on the buried layer. The stacked body includes a plurality of electrode layers stacked with an insulator interposed. The semiconductor body extends in a stacking direction of the stacked body through the stacked body and through the buried layer, and includes a sidewall portion positioned at a side of the buried layer. The silicon film is provided between the buried layer and the sidewall portion of the semiconductor body. The silicon film includes silicon as a major component and further includes at least one of germanium or carbon.

Hereinafter, embodiments will be described with reference to the drawings. Incidentally, in the respective drawings, the same components are denoted by the same reference numerals.

In an embodiment, for example, a semiconductor memory device that includes a memory cell array having a three-dimensional structure is described as a semiconductor device.

FIG. 1 is a schematic perspective view of a memory cell array 1 of an embodiment.

Figure 2:
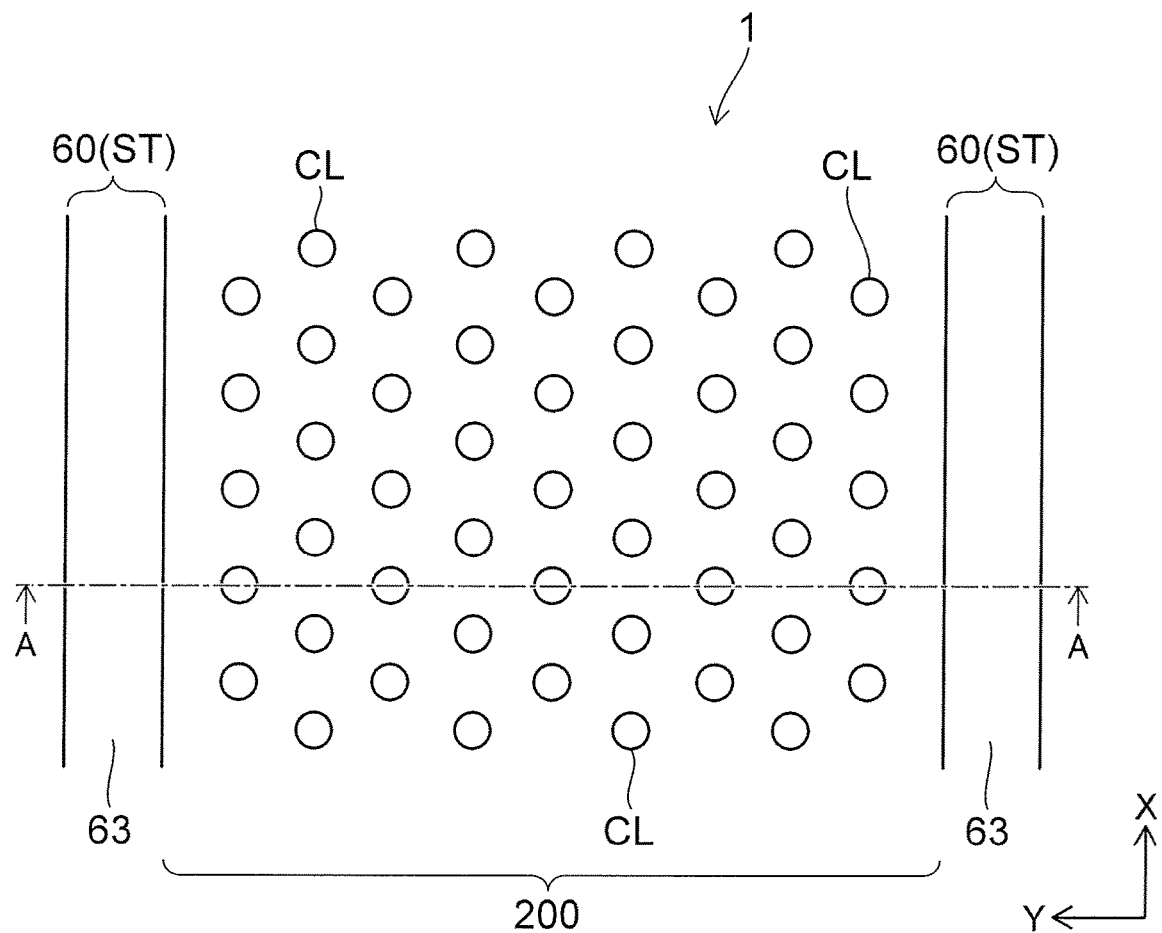
FIG. 2 is a schematic plan view of the semiconductor device of the embodiment.

FIG. 2 is a schematic plan view of the memory cell array 1.

Figure 3:
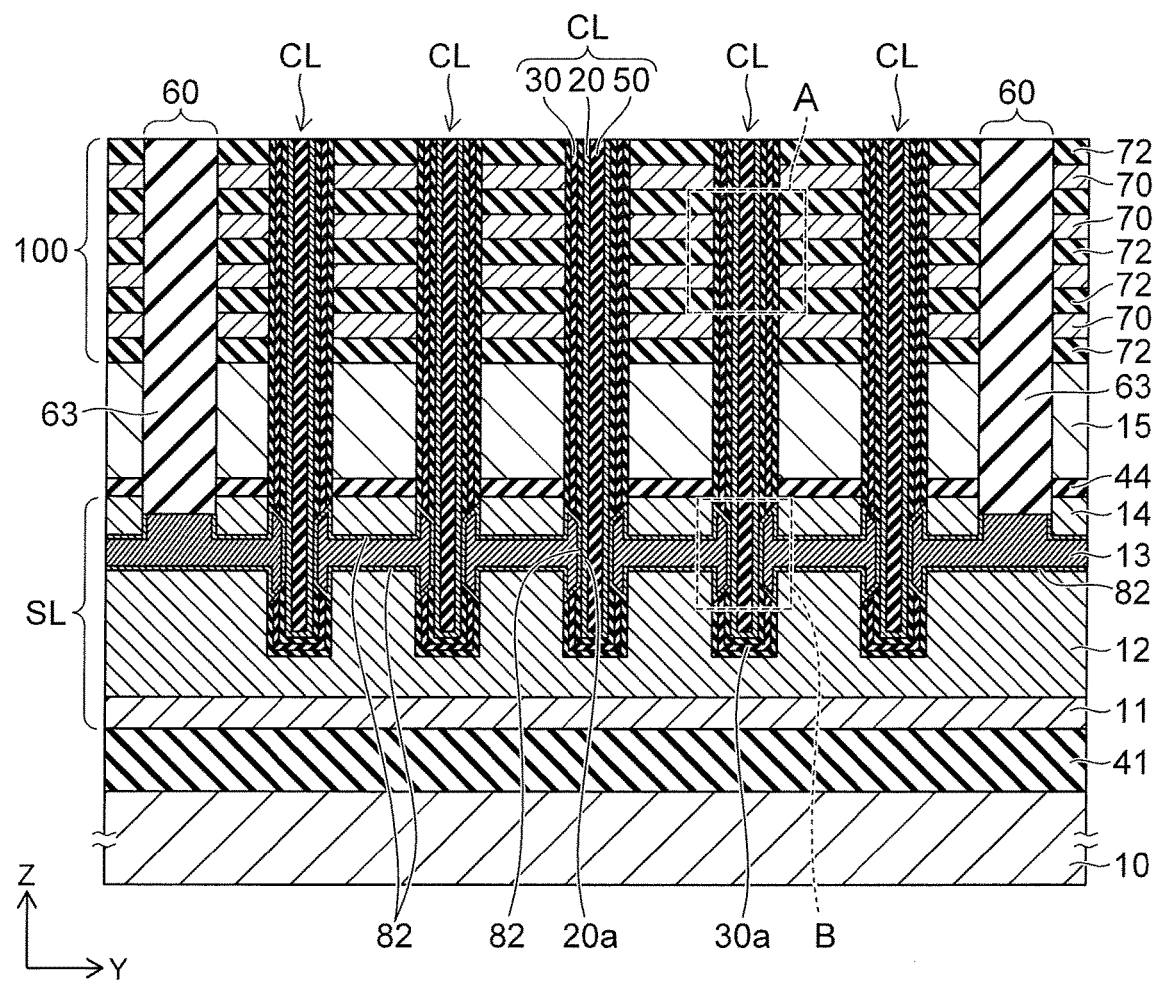
FIG. 3 is an A-A' cross-sectional view of FIG. 2

FIG. 3 is an A-A' cross-sectional view of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction of the other drawings correspond respectively to the X-direction, the Y-direction, and the Z-direction of FIG. 1.

The memory cell array 1 includes a source layer SL, a stacked body 100 provided on the source layer SL, multiple columnar portions CL, multiple separation portions 60, and multiple bit lines BL provided above the stacked body 100.

The source layer SL is provided on the substrate 10 with an insulating layer 41 interposed. The substrate 10 is, for example, a silicon substrate. A gate layer 15 is provided between the source layer SL and the stacked body 100.

The columnar portions CL are formed in substantially circular columnar configurations extending in the stacking direction (the Z-direction) through the stacked body 100. The columnar portions CL further pierce the gate layer 15 under the stacked body 100 and reach the source layer SL. For example, the multiple columnar portions CL have a staggered arrangement. Or, the multiple columnar portions CL may have a square lattice arrangement along the X-direction and the Y-direction.

The separation portions 60 divide the stacked body 100 and the gate layer 15 into multiple blocks (or fingers) in the Y-direction. The separation portion 60 has a structure in which an insulating film 63 is filled into a slit ST shown in FIG. 17 described below.

The multiple bit lines BL extend in the Y-direction and are, for example, metal films. The multiple bit lines BL are separated from each other in the X-direction.

The upper end portion of a semiconductor body 20 of the columnar portion CL described below is connected to the bit line BL via a contact Cb and a contact V1 shown in FIG. 1.

As shown in FIG. 3, the source layer SL includes silicon layers 12 to 14, and a layer 11 that includes a metal.

The layer 11 that includes the metal is provided on the insulating layer 41. The layer 11 that includes the metal is, for example, a tungsten layer or a tungsten silicide layer.

The silicon layer 12 is provided on the layer 11 including the metal; the silicon layer 13 is provided on the silicon layer 12; and the silicon layer 14 is provided on the silicon layer 13.

The silicon layers 12 to 14 include phosphorus as a dopant and are conductive polycrystalline silicon layers.

An insulating layer 44 is provided on the silicon layer 14; and the gate layer 15 is provided on the insulating layer 44. The gate layer 15 includes, for example, phosphorus as a dopant and is a conductive polycrystalline silicon layer.

The stacked body 100 is provided on the gate layer 15. The stacked body 100 includes multiple electrode layers 70 stacked in a direction (the Z-direction) perpendicular to a major surface of the substrate 10. An insulating layer (an insulator) 72 is provided between the electrode layers 70 adjacent to each other above and below. The insulating layer 72 is provided also between the electrode layer 70 of the lowermost layer and the gate layer 15.

The electrode layer 70 is a metal layer. The electrode layer 70 is, for example, a tungsten layer including tungsten as a major component, or a molybdenum layer including molybdenum as a major component. The insulating layer 72 is a silicon oxide layer including silicon oxide as a major component.

Among the multiple electrode layers 70, the electrode layer 70 of at least the uppermost layer is a control gate (a drain-side selection gate) of a drain-side selection transistor STD (FIG. 1); and the electrode layer 70 of at least the lowermost layer is a control gate (a source-side selection gate) of a source-side selection transistor STS (FIG. 1).

The electrode layers 70 of multiple layers are provided as cell gates between the drain-side selection gate and the source-side selection gate.

The thickness of the gate layer 15 is thicker than the thickness of one layer of the electrode layers 70 and the thickness of one layer of the insulating layers 72.

The multiple columnar portions CL extend in the stacking direction through the stacked body 100, further pierce the gate layer 15, the insulating layer 44, the silicon layer 14, and the silicon layer 13, and reach the silicon layer 12. The columnar portion CL includes a memory film 30, the semiconductor body 20, and an insulative core film 50.

As shown in FIG. 3, the semiconductor body 20 is formed in a pipe-like configuration extending to be continuous through the stacked body 100 and through the gate layer 15 in the Z-direction and reaching the source layer SL. The core film 50 is provided on the inner side of the semiconductor body 20 having the pipe-like configuration.

The upper end portion of the semiconductor body 20 is connected to the bit line BL via the contact Cb and the contact V1 shown in FIG. 1.

The memory film 30 is provided between the stacked body 100 and the semiconductor body 20 and between the gate layer 15 and the semiconductor body 20 and surrounds the semiconductor body 20 from the outer perimeter side. The memory film 30 extends to be continuous through the stacked body 100 and through the gate layer 15 in the Z-direction.

The semiconductor body 20 includes a sidewall portion (a source contact portion) 20a electrically connected to the source layer SL. The sidewall portion 20a is not covered with the memory film 30.

The lower end portion of the semiconductor body 20 is continuous with the sidewall portion 20a, is positioned lower than the sidewall portion 20a, and is positioned inside the silicon layer 12. The memory film 30 is provided between the silicon layer 12 and the lower end portion of the semiconductor body 20. The memory film 30 is divided in the Z-direction at the position of the sidewall portion (the source contact portion) 20a of the semiconductor body 20. A lower portion 30a of the divided memory film 30 is disposed under the bottom surface of the semiconductor body 20 and at a position surrounding the lower end portion outer perimeter of the semiconductor body 20.

Figure 4:
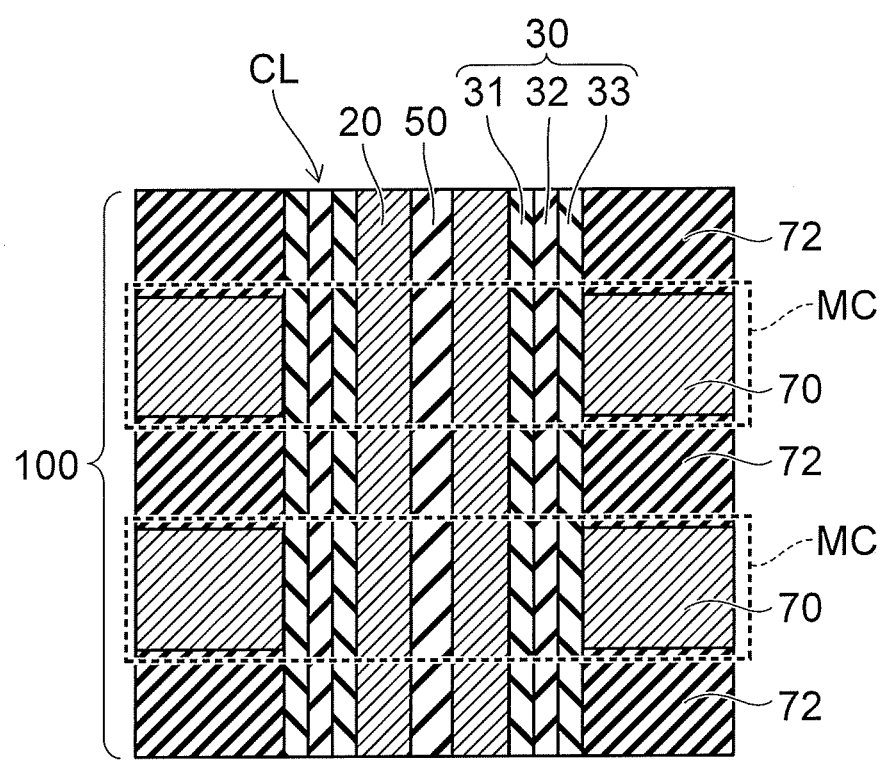
FIG. 4 is an enlarged view of portion A of FIG. 3.

FIG. 4 is an enlarged cross-sectional view of portion A of FIG. 3.

The memory film 30 is a stacked film of insulating films including a tunneling insulating film 31, a charge storage film (a charge storage portion) 32, and a blocking insulating film 33.

The tunneling insulating film 31 is provided between the semiconductor body 20 and the charge storage film 32 and contacts the semiconductor body 20. The charge storage film 32 is provided between the tunneling insulating film 31 and the blocking insulating film 33. The blocking insulating film 33 is provided between the charge storage film 32 and the electrode layer 70.

The semiconductor body 20, the memory film 30, and the electrode layer 70 are included in a memory cell MC. The memory cell MC has a vertical transistor structure in which the electrode layer 70 surrounds the periphery of the semiconductor body 20 with the memory film 30 interposed.

In the memory cell MC having the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes, for example, a silicon oxide film. Or, the blocking insulating film 33 may be a stacked film of a silicon oxide film and a metal oxide film. In such a case, the silicon oxide film may be provided between the charge storage film 32 and the metal oxide film; and the metal oxide film may be provided between the silicon oxide film and the electrode layer 70. The metal oxide film is, for example, an aluminum oxide film.

As shown in FIG. 1, the drain-side selection transistor STD is provided in the upper layer portion of the stacked body 100. The source-side selection transistor STS is provided in the lower layer portion of the stacked body 100. The drain-side selection transistor STD and the source-side selection transistor STS are vertical transistors having the semiconductor body 20 as channels.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 and are included in one memory string. For example, the memory strings have a staggered arrangement in a planar direction parallel to the XY plane;

and the multiple memory cells MC are provided three-dimensionally in the X-direction, the Y-direction, and the Z-direction.

In a read operation, electrons are supplied from the source layer SL to the channel of the memory cell MC via the sidewall portion 20a of the semiconductor body 20.

In the case where a dopant (e.g., phosphorus) is caused to diffuse into the portion of the semiconductor body 20 opposing the gate layer 15, the gate layer 15 can function as a GIDL (gate induced drain leakage) generator in an erase operation.

Holes are generated by applying a high electric field to the portion of the semiconductor body 20 opposing the gate layer 15 by applying an erasing potential (e.g., several volts) to the gate layer 15; the holes are supplied to the channels of the memory cells MC; and the channel potential is increased. Then, the holes are injected into the charge storage film 32 by the potential difference between the semiconductor body 20 and the electrode layers 70 by setting the potentials of the electrode layers 70 of the memory cells MC to, for example, a ground potential (0 V); and the erase operation of the data is performed.

Figure 5A:
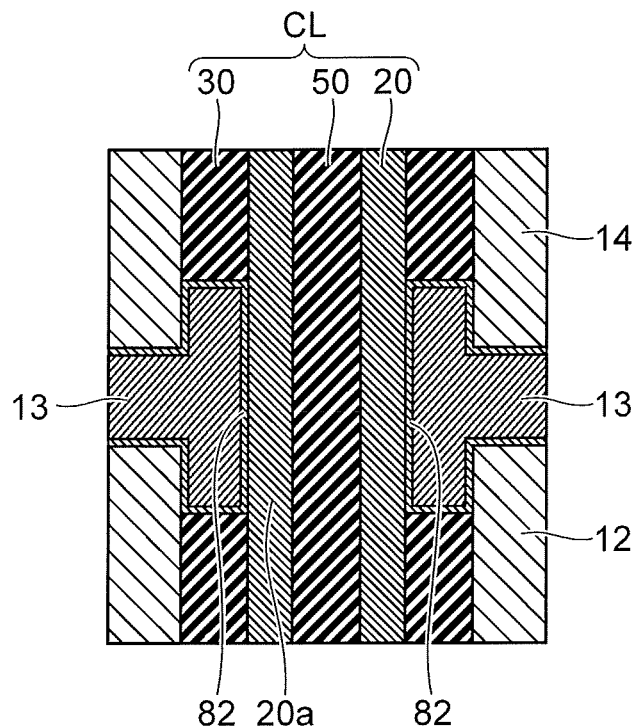
FIGS. 5A and 5B are enlarged views of portion B of FIG. 3.

FIG. 5A is an enlarged view of portion B of FIG. 3 which is a schematic cross-sectional view of the semiconductor device of the first embodiment.

The silicon layer 13 surrounds the sidewall portion 20a of the semiconductor body 20; and the sidewall portion 20a is positioned at the side of the silicon layer 13.

A silicon film 82 is provided between the silicon layer 13 and the sidewall portion 20a of the semiconductor body 20. The silicon film 82 contacts the sidewall portion 20a of the semiconductor body 20.

As shown in FIG. 3, the silicon film 82 is provided also between the silicon layer 12 and the silicon layer 13 and between the silicon layer 13 and the silicon layer 14. The silicon film 82 is a silicon film including silicon (Si) as a major component and further includes at least one of germanium (Ge) or carbon (C). The silicon film 82 further includes phosphorus (P).

In other words, the silicon film 82 is a silicon film doped with germanium and phosphorus. Or, the silicon film 82 is a silicon film doped with carbon and phosphorus. Or, the silicon film 82 is a silicon film doped with germanium, carbon, and phosphorus.

A method for manufacturing the semiconductor device of the first embodiment will now be described with reference to FIG. 6 to FIG. 17. The cross sections shown in FIG. 6 to FIG. 17 correspond to the cross section shown in FIG. 3.

Figure 6:
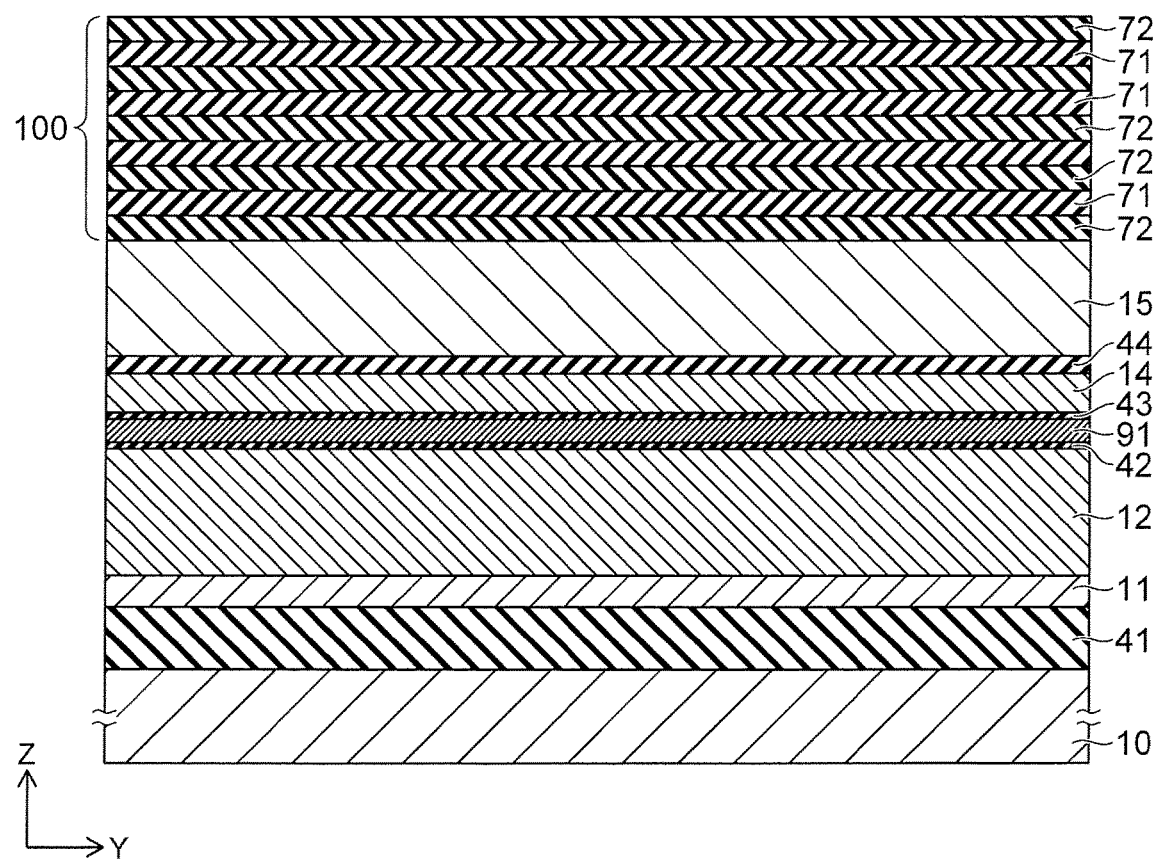
FIG. 6 to FIG. 17 are schematic cross-sectional views showing a method for manufacturing a semiconductor device of a first embodiment.

As shown in FIG. 6, the insulating layer 41 is formed on the substrate 10; and the layer 11 that includes the metal is formed on the insulating layer 41. The layer 11 that includes the metal is, for example, a tungsten layer or a tungsten silicide layer.

The silicon layer 12 is formed on the layer 11 including the metal. The silicon layer 12 is a polycrystalline silicon layer doped with phosphorus.

A protective film 42 is formed on the silicon layer 12. The protective film 42 is, for example, a silicon oxide film. A sacrificial layer 91 is formed on the protective film 42. The sacrificial layer 91 is, for example, an undoped polycrystalline silicon layer not doped with a dopant intentionally. A protective film 43 is formed on the sacrificial layer 91. The protective film 43 is, for example, a silicon oxide film. The silicon layer 14 is formed on the protective film 43. The silicon layer 14 is, for example, an undoped polycrystalline silicon layer or a phosphorus-doped polycrystalline silicon layer.

The insulating layer 44 is formed on the silicon layer 14. The insulating layer 44 is, for example, a silicon oxide layer. The gate layer 15 is formed on the insulating layer 44. The gate layer 15 is, for example, a polycrystalline silicon layer doped with phosphorus.

The stacked body 100 is formed on the gate layer 15. The insulating layer (a second layer) 72 and a sacrificial layer (a first layer) 71 are stacked alternately on the gate layer 15. The multiple sacrificial layers 71 and the multiple insulating layers 72 are formed on the gate layer 15 by repeating the process of alternately stacking the insulating layer 72 and the sacrificial layer 71. For example, the sacrificial layer 71 is a silicon nitride layer; and the insulating layer 72 is a silicon oxide layer. The thickness of the gate layer 15 is thicker than the thickness of one layer of the sacrificial layer 71 and the thickness of one layer of the insulating layers 72.

Figure 7:
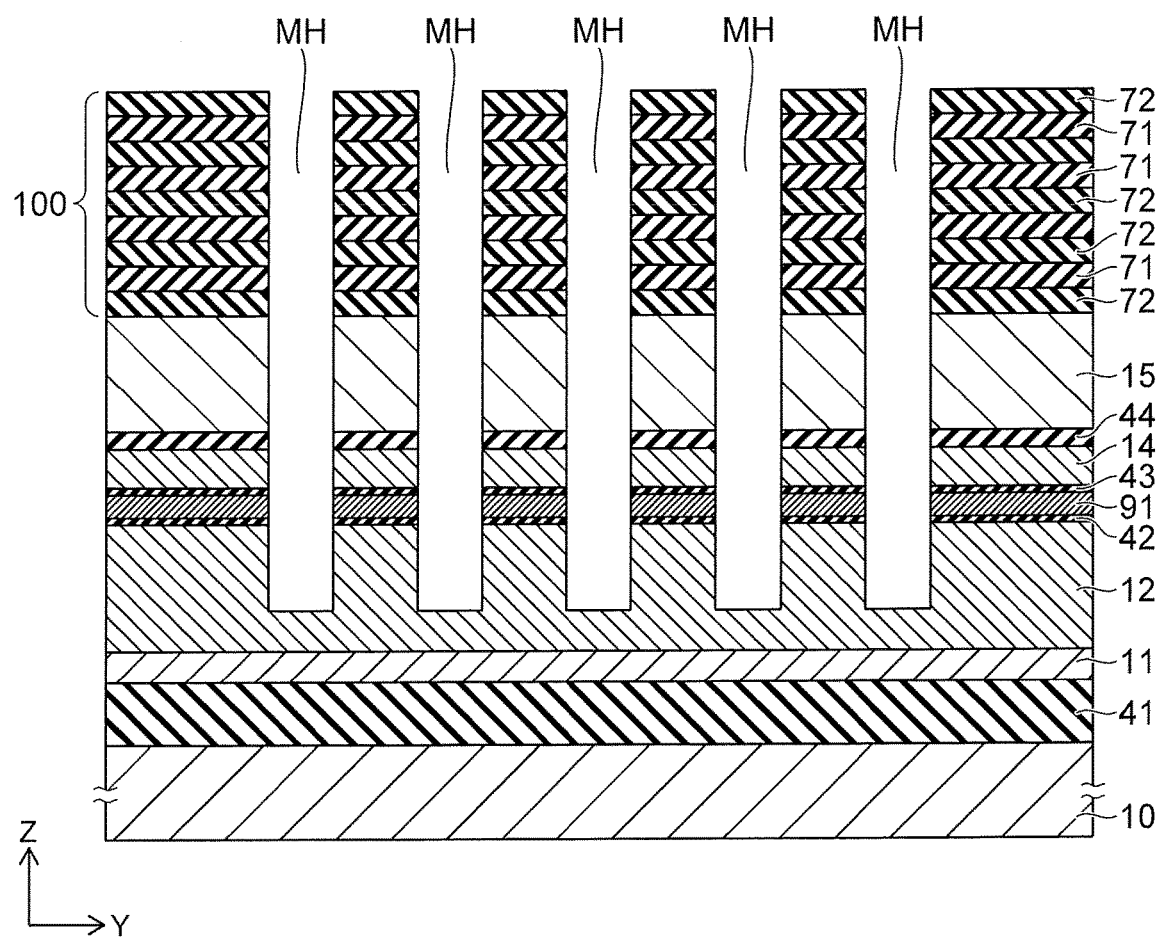

As shown in FIG. 7, for example, multiple memory holes MH are formed in the stacked body 100 by RIE (reactive ion etching) using a not-illustrated mask. The memory holes MH pierce the stacked body 100, the gate layer 15, the insulating layer 44, the silicon layer 14, the protective film 43, the sacrificial layer 91, and the protective film 42 and reach the silicon layer 12. The bottoms of the memory holes MH are positioned inside the silicon layer 12.

The multiple sacrificial layers (the silicon nitride layers) 71 and the multiple insulating layers (the silicon oxide layers) 72 are etched continuously using the same gas (e.g., a CF-based gas) without switching the gas type. At this time, the gate layer (the polycrystalline silicon layer) 15 functions as an etching stopper; and the etching is stopped once at the position of the gate layer 15. The etching rate fluctuation between the multiple memory holes MH is absorbed by the thick gate layer 15; and the fluctuation of the bottom position between the multiple memory holes MH is reduced.

Subsequently, step etching of the gate layer 15 and the layers lower than the gate layer 15 is performed by switching the gas type. The etching is stopped partway through the silicon layer 12.

By the thick gate layer 15, the control of the etching stop position of the high-aspect ratio hole patterning of the stacked body 100 is easy.

Figure 8:
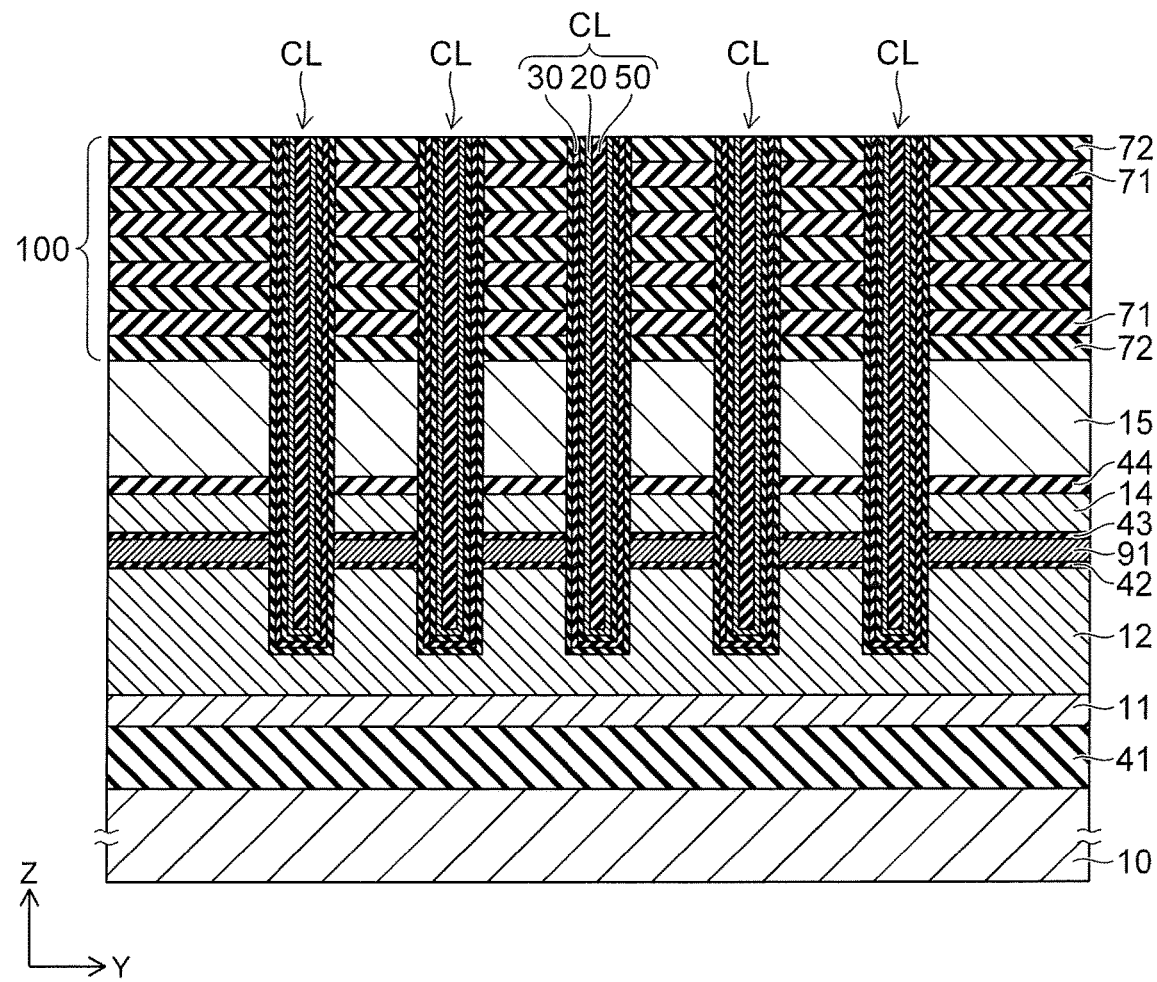

As shown in FIG. 8, the columnar portions CL are formed inside the memory holes MH. The memory film 30 is formed conformally along the side surfaces and the bottom surfaces of the memory holes MH. The semiconductor body 20 is formed conformally along the memory film 30 on the inner side of the memory film 30; and the core film 50 is formed on the inner side of the semiconductor body 20.

Figure 9:
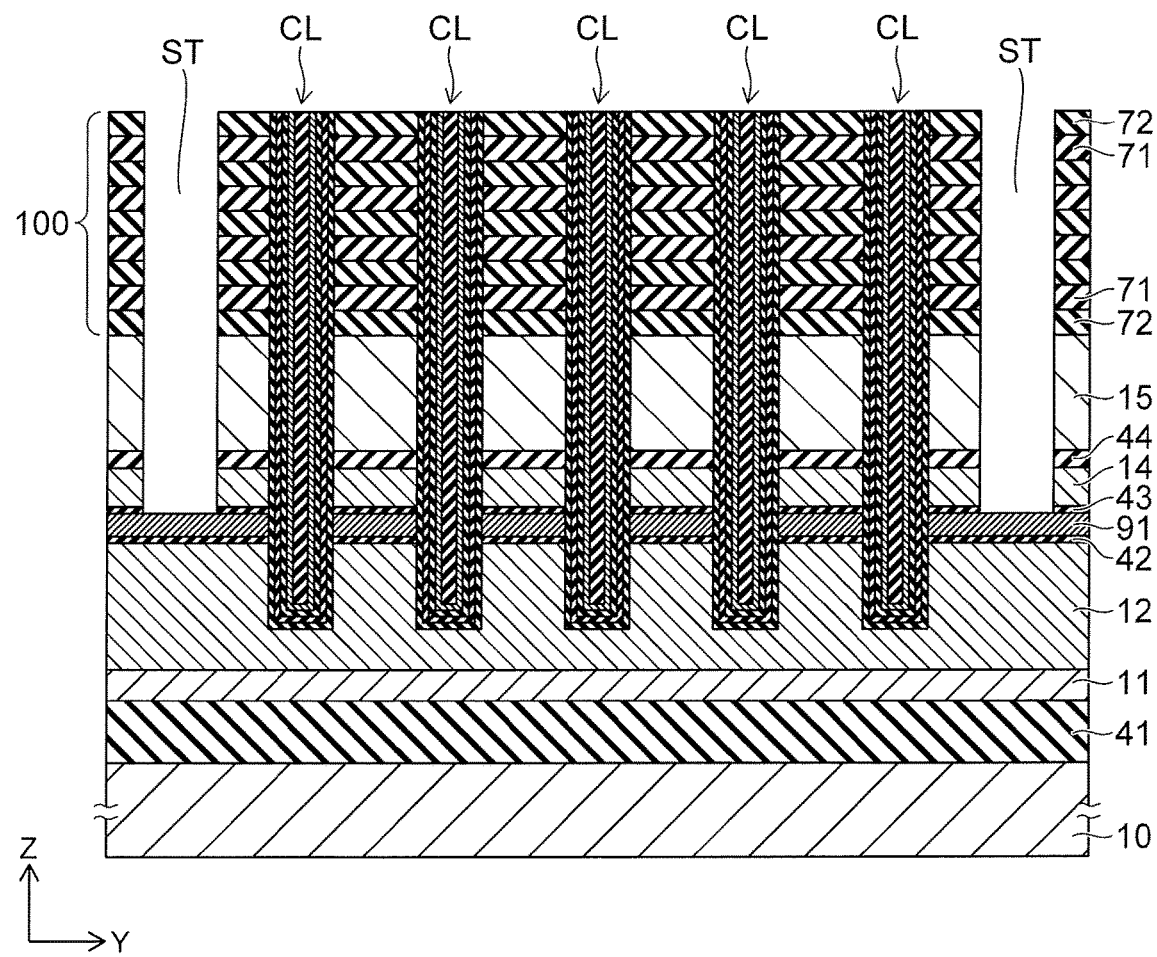

Subsequently, as shown in FIG. 9, the multiple slits ST are formed in the stacked body 100. The slits ST are formed by RIE using a not-illustrated mask. The slits ST pierce the stacked body 100, the gate layer 15, the insulating layer 44, the silicon layer 14, and the protective film 43 and reach the sacrificial layer 91.

Similarly to the formation of the memory holes MH, the multiple sacrificial layers 71 and the multiple insulating layers are etched continuously using the same gas without switching the gas type. At this time, the gate layer 15 functions as an etching stopper; and the etching of the slit patterning is stopped once at the position of the gate layer 15. By the thick gate layer 15, the etching rate fluctuation between the multiple slits ST is absorbed; and the fluctuation of the bottom position between the multiple slits ST is reduced.

Subsequently, step etching of the gate layer 15 and the layers lower than the gate layer 15 is performed by switching the gas type; and the sacrificial layer 91 is exposed at the bottoms of the slits ST.

By the thick gate layer 15, the control of the etching stop position of the high-aspect ratio slit patterning of the stacked body 100 is easy. Further, in the subsequent step etching, the bottom position control of the slits ST is performed easily and with high precision. The bottoms of the slits ST stop inside the sacrificial layer 91 without the slits ST extending through the sacrificial layer 91.

Figure 10:
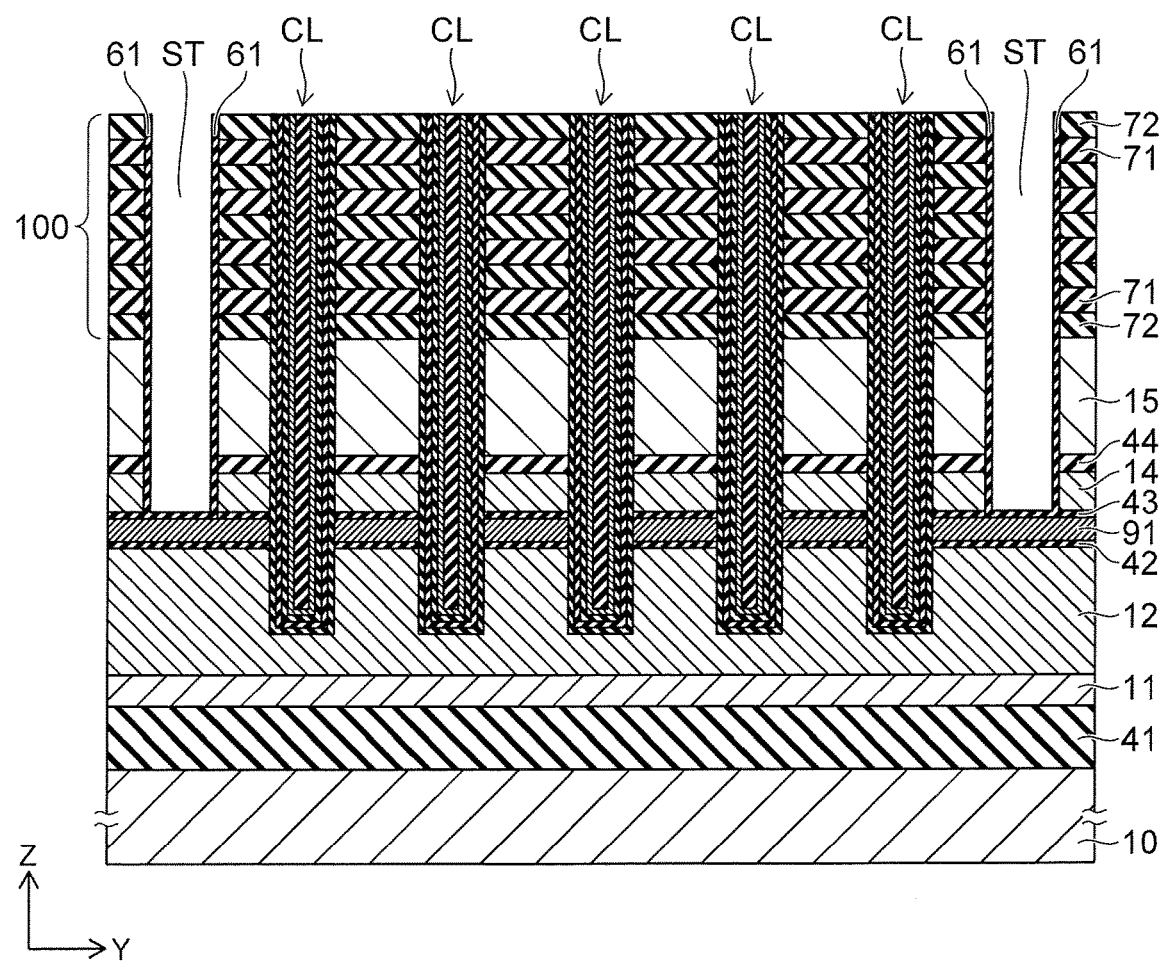
Figure 11:
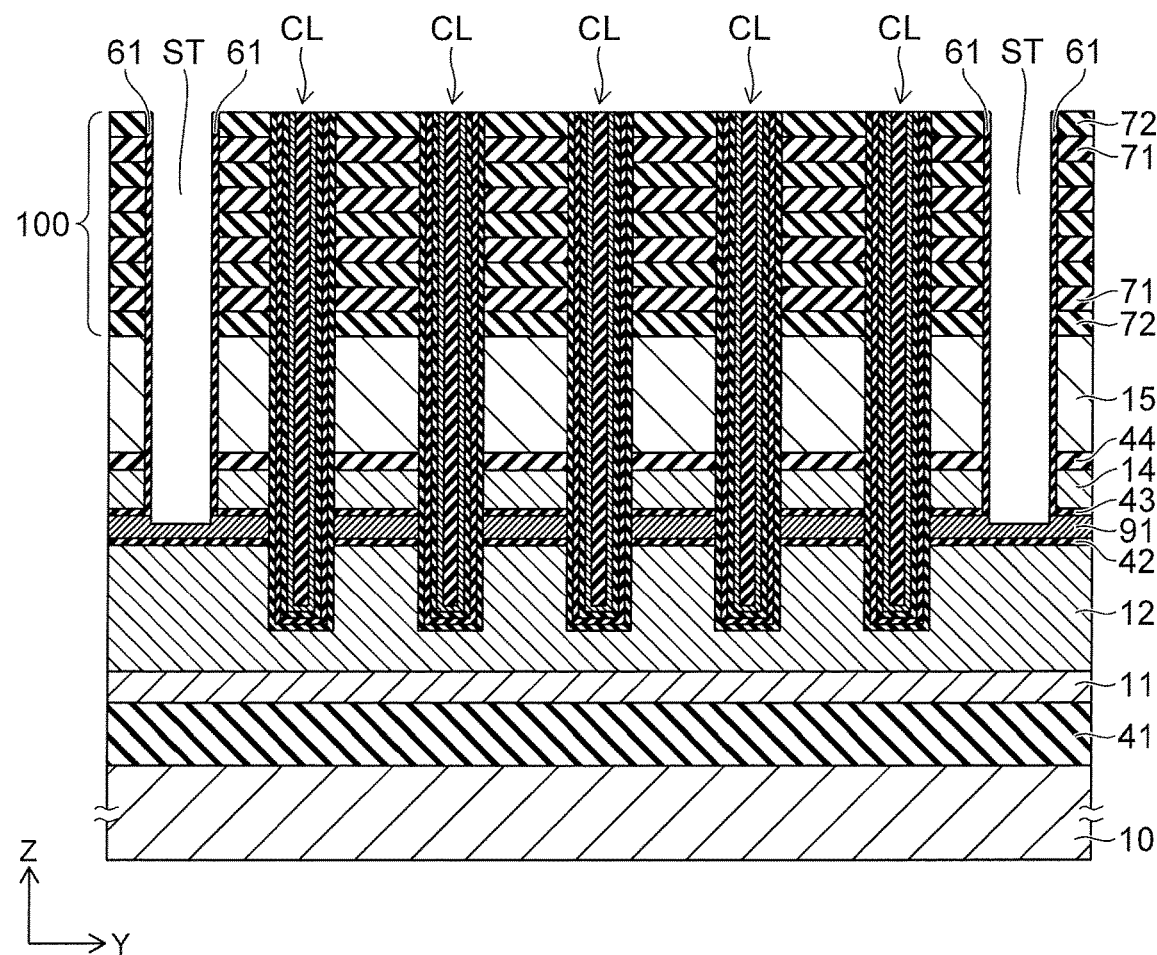

As shown in FIG. 10, a liner film 61 is formed conformally along the side surfaces and the bottom surfaces of the slits ST. The liner film 61 is, for example, a silicon nitride film. For example, the liner film 61 that is formed on the bottom surfaces of the slits ST is removed by RIE. As shown in FIG. 11, the sacrificial layer 91 is exposed at the bottoms of the slits ST.

Then, the sacrificial layer 91 is removed by etching through the slits ST. For example, the sacrificial layer 91 which is a polycrystalline silicon layer is removed by supplying hot TMY (trimethyl-2 hydroxyethyl ammonium hydroxide) through the slits ST.

Figure 12:
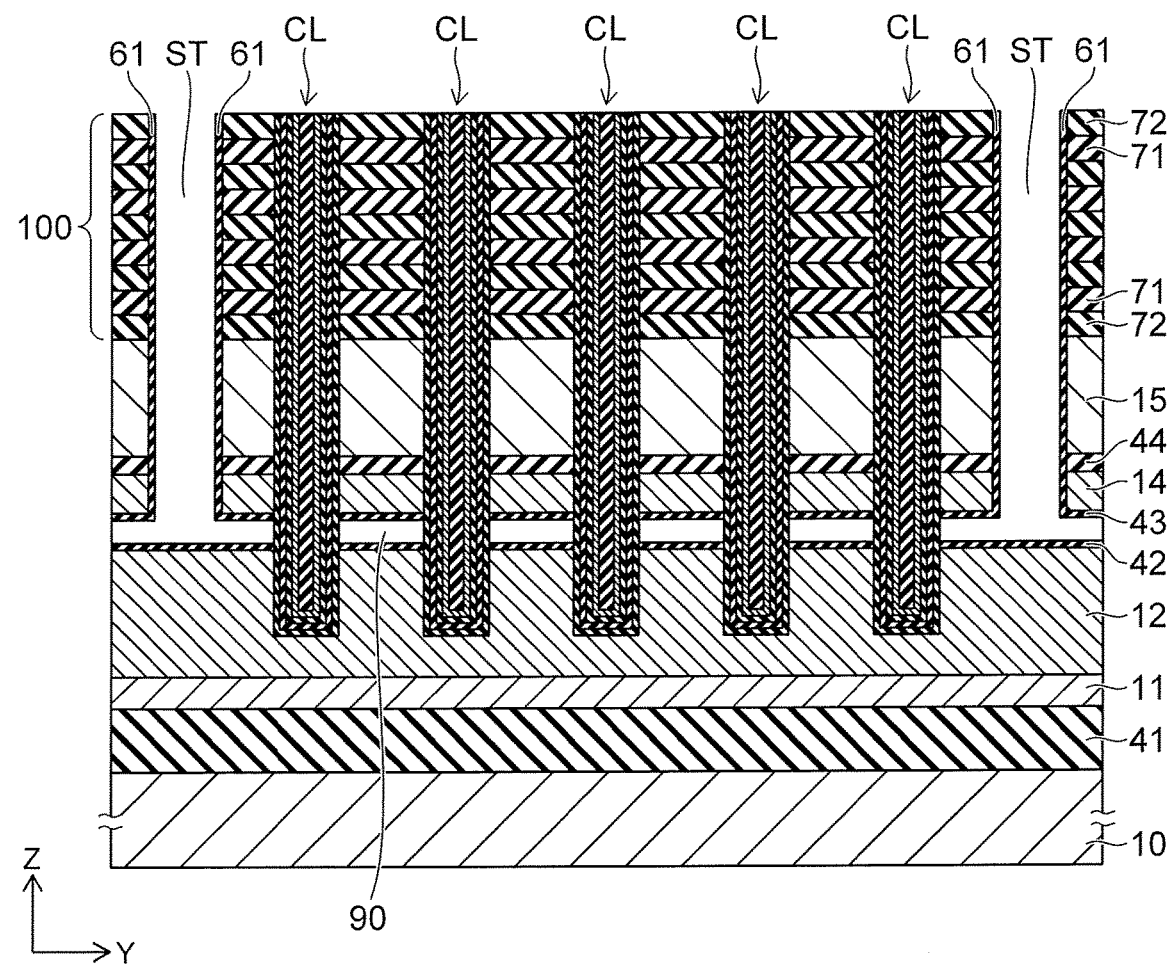

The sacrificial layer 91 is removed; and an air gap 90 is formed between the silicon layer 12 and the silicon layer 14 as shown in FIG. 12. For example, the protective films 42 and 43 which are silicon oxide films protect the silicon layers 12 and 14 from the etching by hot TMY. The liner film (e.g., the silicon nitride film) 61 that is formed on the side surfaces of the slits ST prevents side etching of the gate layer 15 and the silicon layer 14 from the slit ST side.

A portion of the sidewall of the columnar portion CL is exposed in the air gap 90. In other words, a portion of the memory film 30 is exposed in the air gap 90.

The memory film 30 that is exposed in the air gap 90 is removed by etching through the slits ST. For example, the memory film 30 is removed by CDE (chemical or conformal dry etching).

At this time, the protective films 42 and 43 which are the same types of films as the films included in the memory film 30 also are removed. Although the liner film 61 that is formed on the side surfaces of the slits ST is, for example, the same type of silicon nitride film as the charge storage film 32 included in the memory film 30, the film thickness of the liner film 61 is thicker than the film thickness of the charge storage film 32; and the liner film 61 remains on the side surfaces of the slits ST.

The liner film 61 prevents side etching from the slit ST side of the sacrificial layers 71, the insulating layers 72, and the insulating layer 44 of the stacked body 100 when removing the portion of the memory film 30 recited above exposed at the air gap 90. Because the lower surface of the insulating layer 44 is covered with the silicon layer 14, etching is prevented also from the lower surface side of the insulating layer 44.

Figure 13:
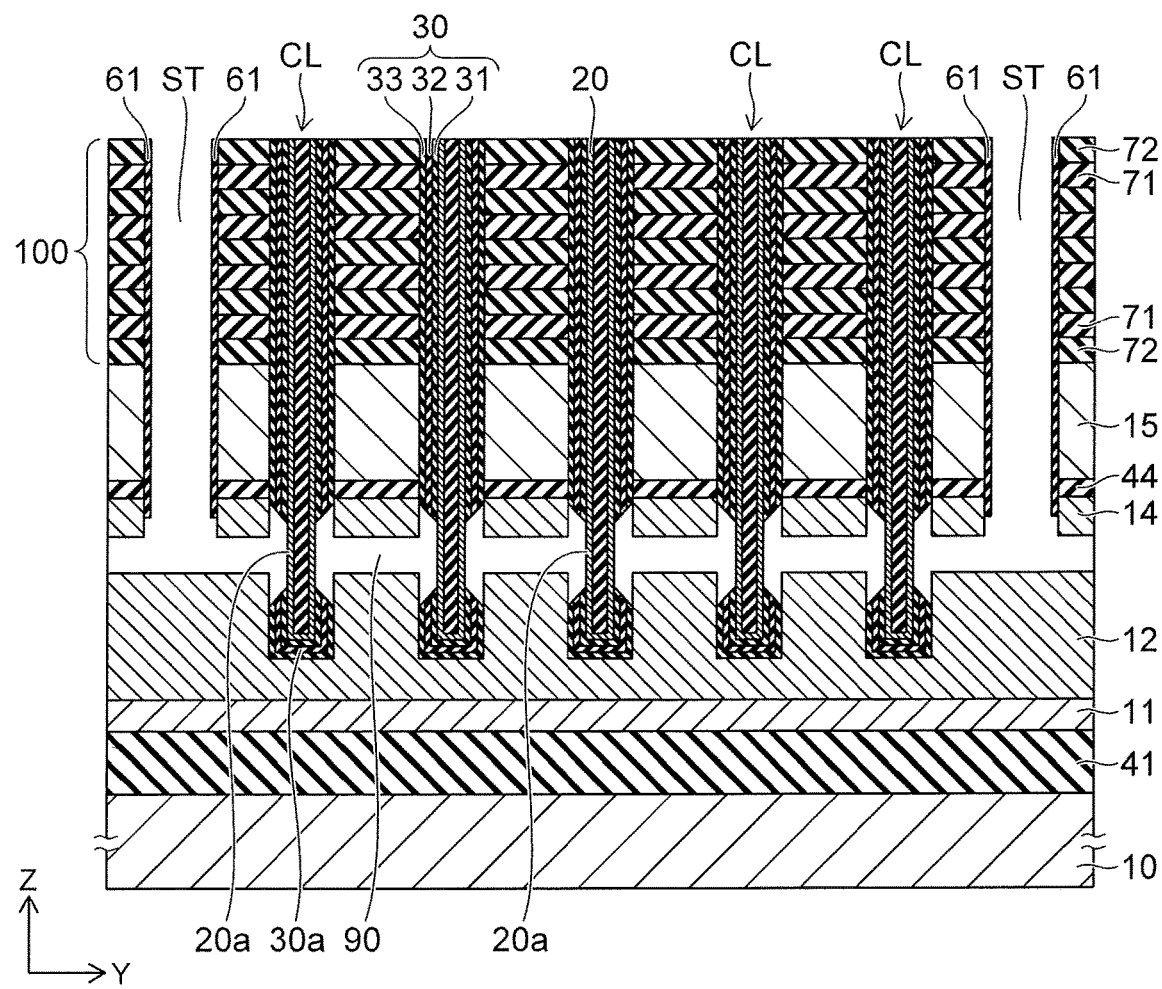

A portion of the memory film 30 is removed; and memory film 30 is divided in the stacking direction (the Z-direction) as shown in FIG. 13. By controlling the etching time, the memory film (the gate insulating film) 30 that is between the gate layer 15 and the semiconductor body 20 is not etched.

Also, by controlling the etching time, the lower portion 30a of the memory film 30 lower than the air gap 90 remains inside the silicon layer 12. The lower end portion of the columnar portion CL remains inside the silicon layer 12 as an anchor. The silicon layer 12 surrounds the lower end portions of the columnar portions CL and maintains a stable support state of the columnar portions CL in the state in which the air gap 90 is formed.

The portion of the memory film 30 recited above is removed; and a portion (the sidewall portion 20a) of the semiconductor body 20 is exposed in the air gap 90. The lower surface of the silicon layer 14 and the upper surface of the silicon layer 12 also are exposed in the air gap 90 by removing the protective films 42 and 43.

Figure 14:
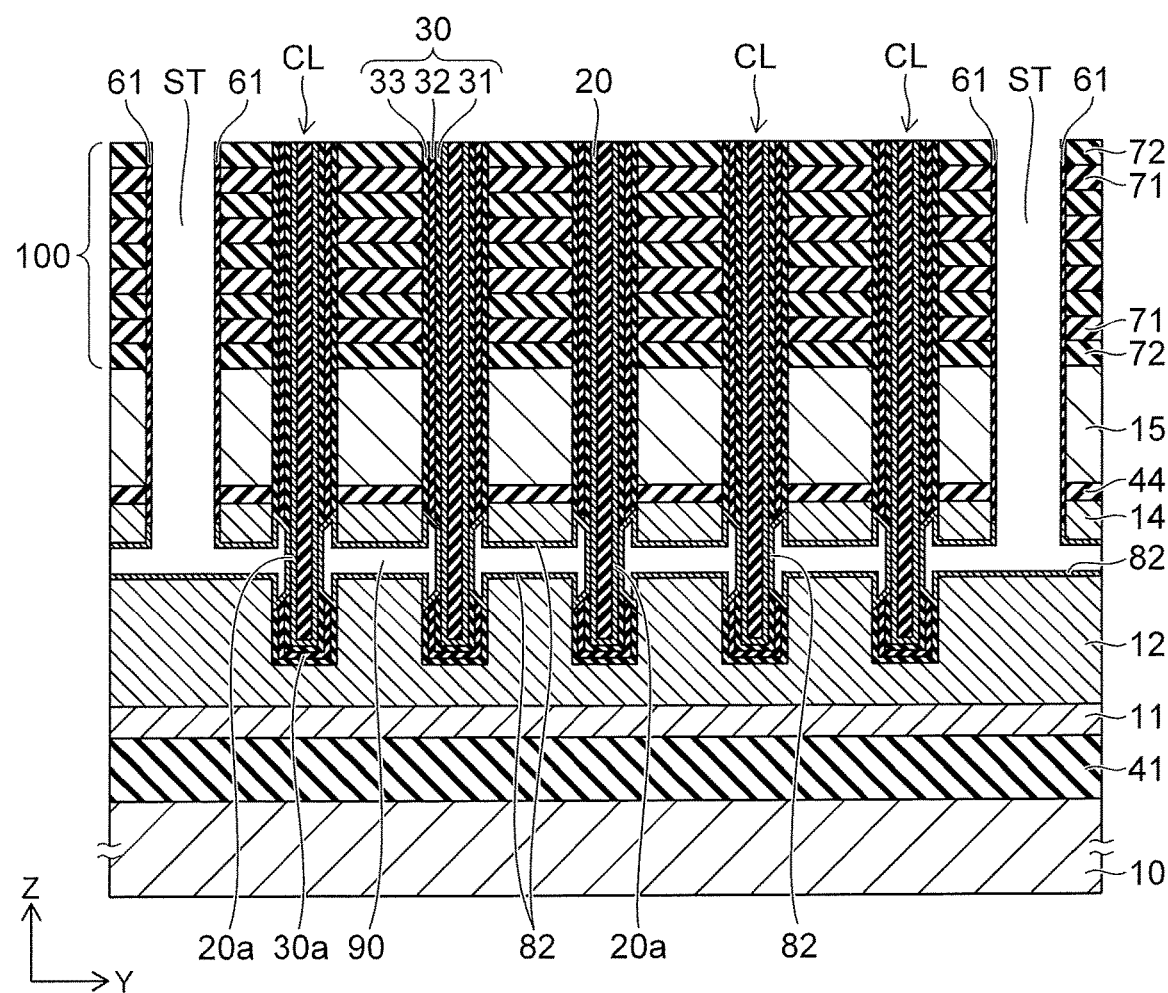

Then, a film formation source gas is supplied to the interior of the air gap 90 through the slits ST; and the silicon film 82 is formed on the sidewall portion 20a of the semiconductor body 20, the silicon layer 12, and the silicon layer 14 exposed in the air gap 90. As shown in FIG. 14, the silicon film 82 is formed conformally along the surfaces of the silicon material portions exposed in the air gap 90. The silicon film 82 is formed on the inner wall of the air gap 90 but does not fill the air gap 90. The air gap 90 remains.

After forming the silicon film 82, a film formation source gas is supplied to the interior of the air gap 90 through the slits ST; and a material of a buried layer is formed on the surface of the silicon film 82 exposed in the air gap 90.

Figure 15:
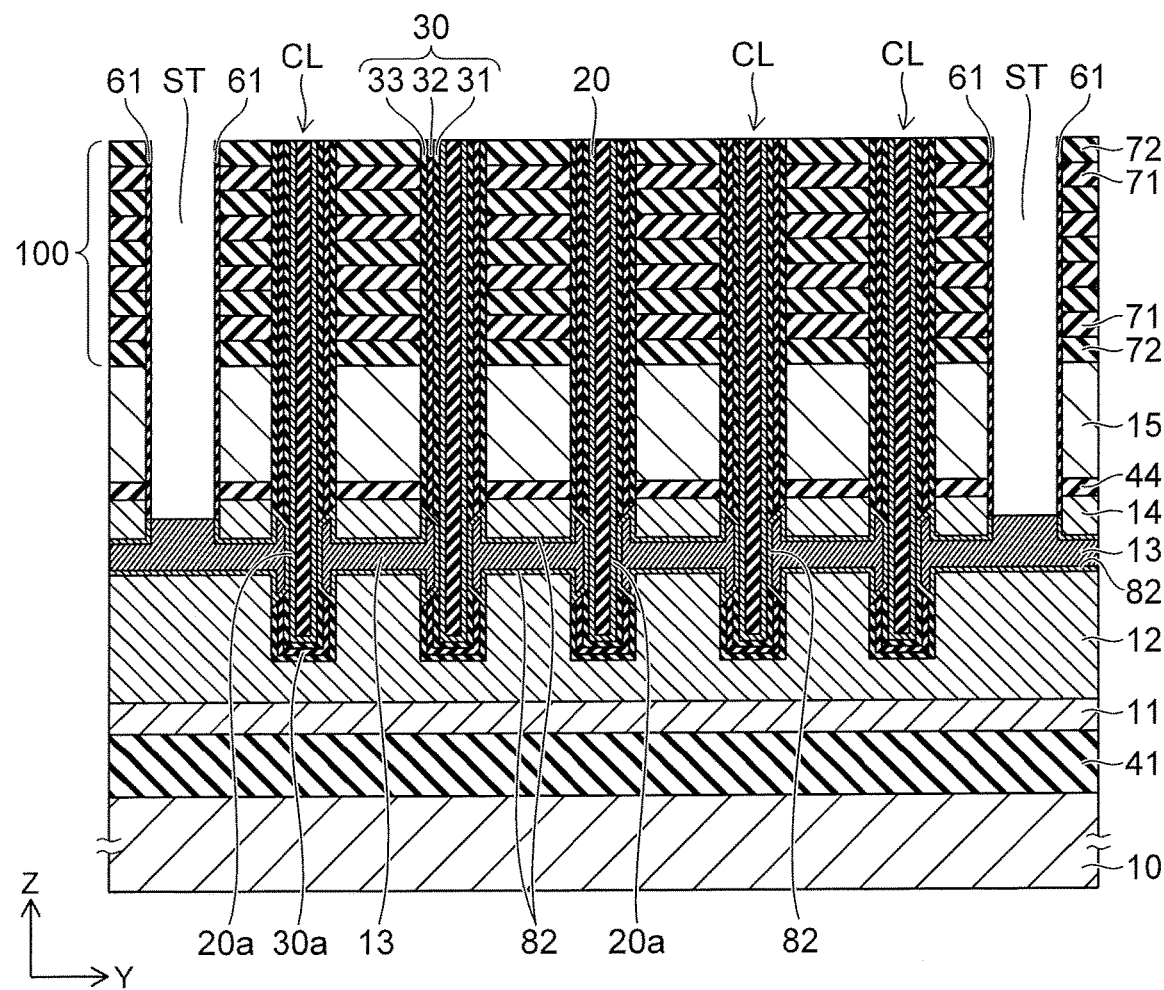

As shown in FIG. 15, the silicon layer 13 is filled into the air gap 90 as the buried layer. Or, the buried layer may be a silicon oxide layer.

The silicon film 82 contacts the sidewall portion 20a of the semiconductor body 20. When the columnar portions CL are formed, the semiconductor bodies 20 substantially do not include a dopant. When forming the buried layer (the silicon layer or the silicon oxide layer) 13 in the air gap 90, the material of the buried layer is formed in high-temperature annealing. At this time, the phosphorus that is included in the silicon layer 12 of the foundation diffuses also into the silicon film 82 and the sidewall portion 20a of the semiconductor body 20. Accordingly, the contact portion (the source contact portion) between the silicon film 82 and the sidewall portion 20a of the semiconductor body 20 becomes phosphorus-doped silicon; and the resistance is reduced.

It is desirable for the phosphorus to diffuse from the sidewall portion 20a into at least the portion of the semiconductor body 20 opposing the insulating layer 44.

In the case where the buried layer 13 is a silicon layer, the phosphorus diffuses from the silicon layer 12 also into the buried layer (the silicon layer) 13; and the silicon layer 13 becomes a phosphorous-doped silicon layer and functions as one component of the source layer SL.

The phosphorus that is inside the silicon layer 12 also may diffuse into the silicon layer 14 via the silicon film 82 and the silicon layer 13.

The semiconductor body 20 is electrically connected to the source layer SL via the sidewall portion 20a and the silicon film 82. Because the silicon film 82 contacts the silicon layer 12 and the silicon layer 14, the semiconductor body 20 is electrically connected to the source layer SL including the silicon layer 12, the layer 11 including the metal, and the silicon layer 14 via the sidewall portion 20a and the silicon film 82 even in the case where the buried layer 13 is a silicon oxide layer.

Due to the microloading effect when filling the buried layer 13 into the air gap 90, the film formation starts after a shorter incubation time (film formation start time) for regions proximal to the gas supply source (the slits ST); and a phenomenon may undesirably occur in which the air gap 90 is plugged while leaving voids (or seams) in regions distal to the slits ST. In other words, in the regions distal to the gas supply source (the slits ST), compared to the regions at the slit ST vicinity, the process of progressing from surface adsorption of the gas components to deposition is delayed easily due to insufficient gas.

In the case where the voids inside the buried layer 13 undesirably move in the sidewall portion (the source contact portion) 20a of the semiconductor body 20 due to migration in subsequent annealing processes, the voids may cause electrical contact defects between the semiconductor body 20 and the source layer SL.

According to the first embodiment described above, the silicon film 82 is a silicon film including silicon as a major component and further includes at least one of germanium or carbon.

When forming the silicon film 82 by CVD, for example, the silicon film 82 that includes carbon can be formed by adding $C_2H_4$ gas to the source gas of silicon. The carbon concentration in the silicon film 82 can be controlled by the flow rate of the $C_2H_4$ gas.

There is a tendency for the crystal grain size of a silicon film to decrease as the carbon concentration in the silicon film increases. There is a tendency for the hardness of the silicon film to increase as the crystal grain size decreases. Such characteristics due to doping the silicon film with carbon realize an effect of blocking the movement of voids.

Accordingly, when filling the silicon layer 13 into the gap 90, even in the case where voids that may migrate in subsequent annealing processes are undesirably formed inside the silicon layer 13, the carbon-doped silicon film 82 that is formed between the silicon layer 13 and the sidewall portion 20a of the semiconductor body 20 prevents the movement of the voids into the sidewall portion 20a. Thereby, good electrical contact between the semiconductor body 20 and the source layer SL is maintained.

According to knowledge obtained by the inventors, the effect of blocking the movement of voids becomes pronounced when the carbon concentration in the silicon film 82 is set to be $1\times10^{19}$ cm$^{-3}$ or more. Accordingly, it is desirable for the carbon concentration in the silicon film 82 to be $1\times10^{19}$ cm$^{-3}$ or more.

Also, according to knowledge obtained by the inventors, the effect of blocking the movement of voids becomes pronounced when the phosphorus concentration in the silicon film 82 is set to be $1\times10^{20}$ cm$^{-3}$ or more. Accordingly, it is desirable for the phosphorus concentration in the silicon film 82 to be $1\times10^{20}$ cm$^{-3}$ or more.

Also, when the Ge composition ratio in the silicon film increases, the charge of point defects caused by the decrease of the bandgap energy reduces the diffusion constant of the dopant (phosphorus). There is a tendency for the diffusion of phosphorus to be suppressed as the Ge composition ratio increases. Accordingly, by doping the silicon film 82 with Ge and by controlling the composition ratio of Ge, it is possible to control the amount and/or the diffusion distance of the phosphorus diffusing from the silicon layer 12 into the multiple semiconductor bodies 20.

By providing such a Ge-doped silicon film 82, it is possible to suppress the nonuniform diffusion of phosphorus into the multiple semiconductor bodies 20 and suppress the electrical characteristic fluctuation between the memory strings.

According to knowledge obtained by the inventors, in the three-dimensional memory device of the embodiment described above, it is desirable for the Ge composition ratio in the silicon film 82 to be 5 atomic % or more to realize practically effective diffusion control of the phosphorus.

Figure 5B:
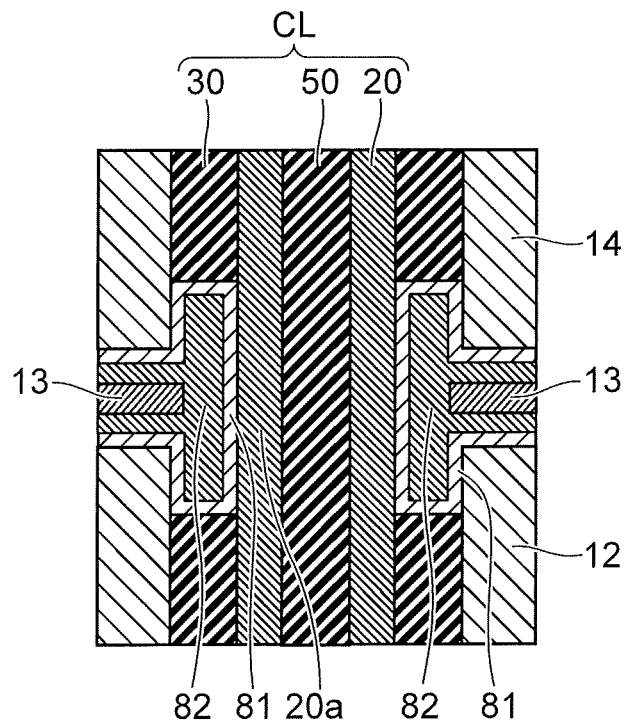

FIG. 5B is a schematic cross-sectional view similar to FIG. 5A and shows another example of the channel-source contact portion.

Before forming the silicon film 82 on the inner wall of the gap 90 in the process shown in FIG. 14 described above, for example, an undoped silicon film 81 is formed conformally on the inner wall of the air gap 90. The silicon film 81 does not fill the air gap 90. Then, the silicon film 82 is formed on the surface of the silicon film 81 exposed in the air gap 90. The silicon film 82 is formed conformally along the surface of the silicon film 81. Subsequently, the buried layer (the silicon layer) 13 is filled into the remaining air gap 90.

The phosphorus that is inside the silicon layer 12 diffuses into the semiconductor body 20 via the silicon film 81 and the silicon film 82.

In the example shown in FIG. 5B as well, the silicon film 82 that is doped with at least one of germanium or carbon is provided between the buried layer 13 and the sidewall portion 20a of the semiconductor body 20.

Therefore, the silicon film 82 prevents the movement of the voids into the sidewall portion 20a and/or suppresses the nonuniform diffusion of the phosphorus.

As shown in FIG. 15 described above, the liner film 61 that is on the side surfaces of the slits ST is removed after forming the buried layer (e.g., the silicon layer) 13. After removing the liner film 61 or in the same process as the process of removing the liner film 61, the sacrificial layers 71 are removed by an etchant or an etching gas supplied via the slits ST. For example, the sacrificial layers 71 which are silicon nitride layers are removed using an etchant including phosphoric acid.

Figure 16:
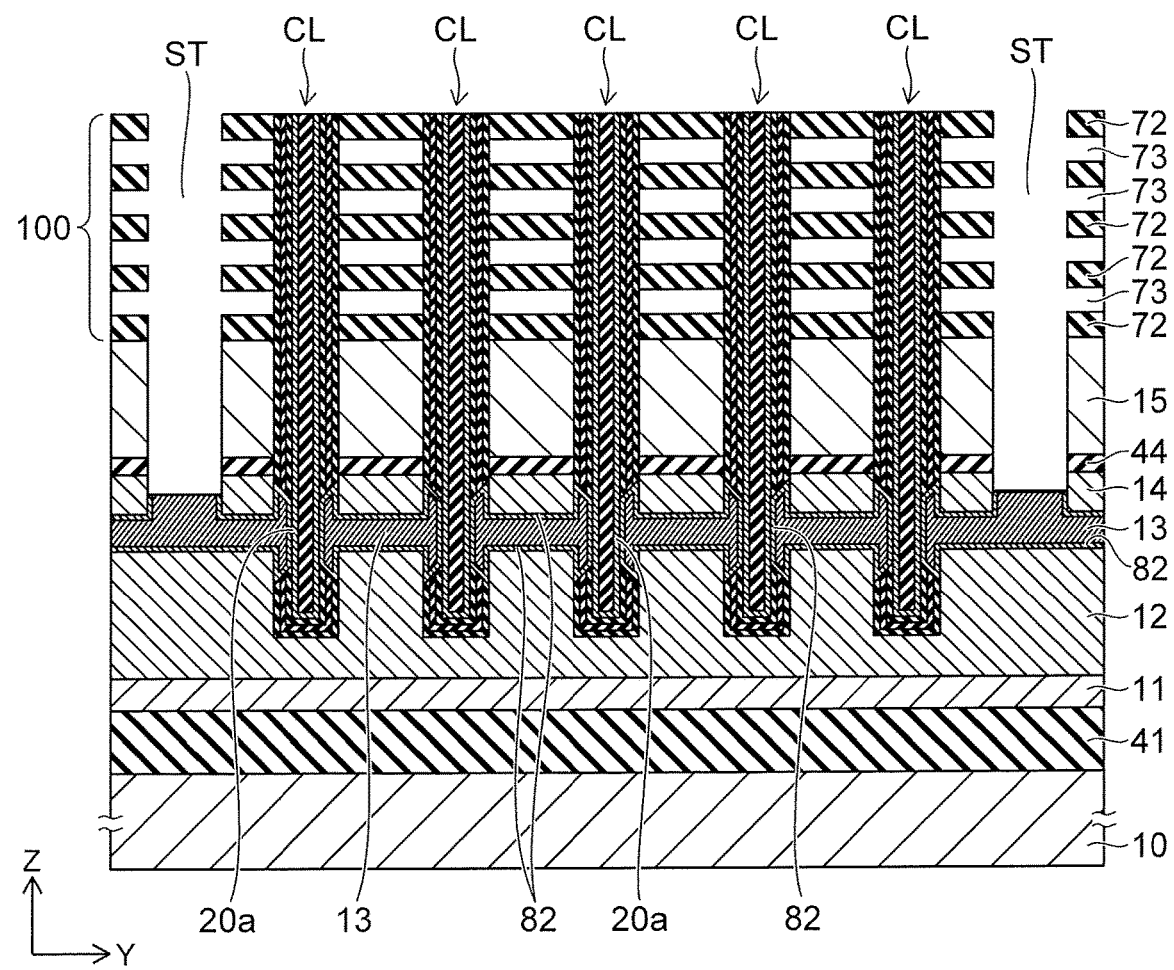

The sacrificial layers 71 are removed; and a gap (an air gap) 73 is formed between the insulating layers 72 adjacent to each other above and below as shown in FIG. 16.

The multiple insulating layers 72 contact the side surfaces of the multiple columnar portions CL to surround the side surfaces of the columnar portions CL. The multiple insulating layers 72 are supported by such a physical bond with the multiple columnar portions CL; and the gap 73 is maintained between the insulating layers 72.

Figure 17:
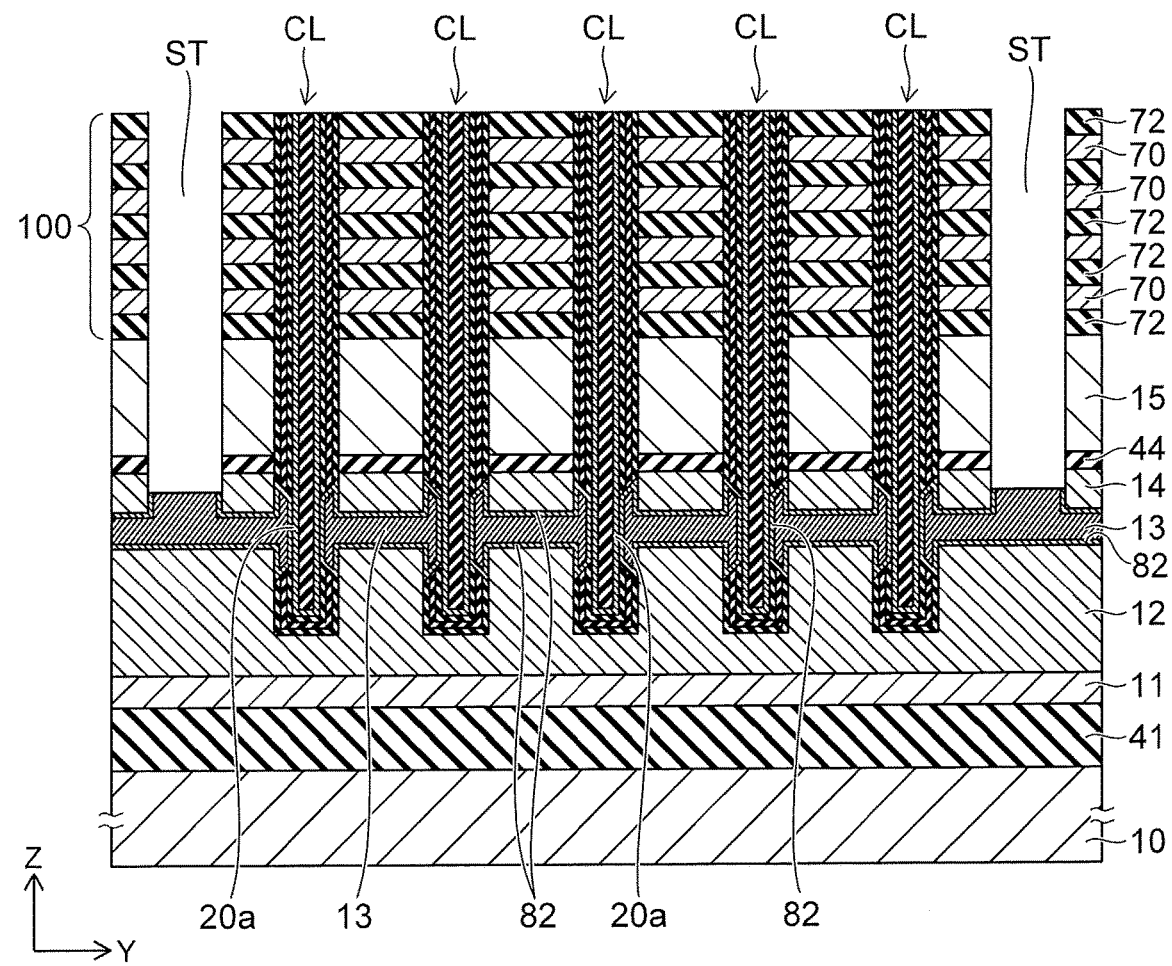

As shown in FIG. 17, the electrode layer 70 is formed in the gap 73. For example, the electrode layer 70 is formed by CVD (chemical vapor deposition). A source gas is supplied to the gap 73 via the slits ST. The electrode layer 70 that is formed on the side surfaces of the slits ST is removed. Subsequently, the insulating film 63 shown in FIG. 3 is filled into the slits ST.

Figure 18:
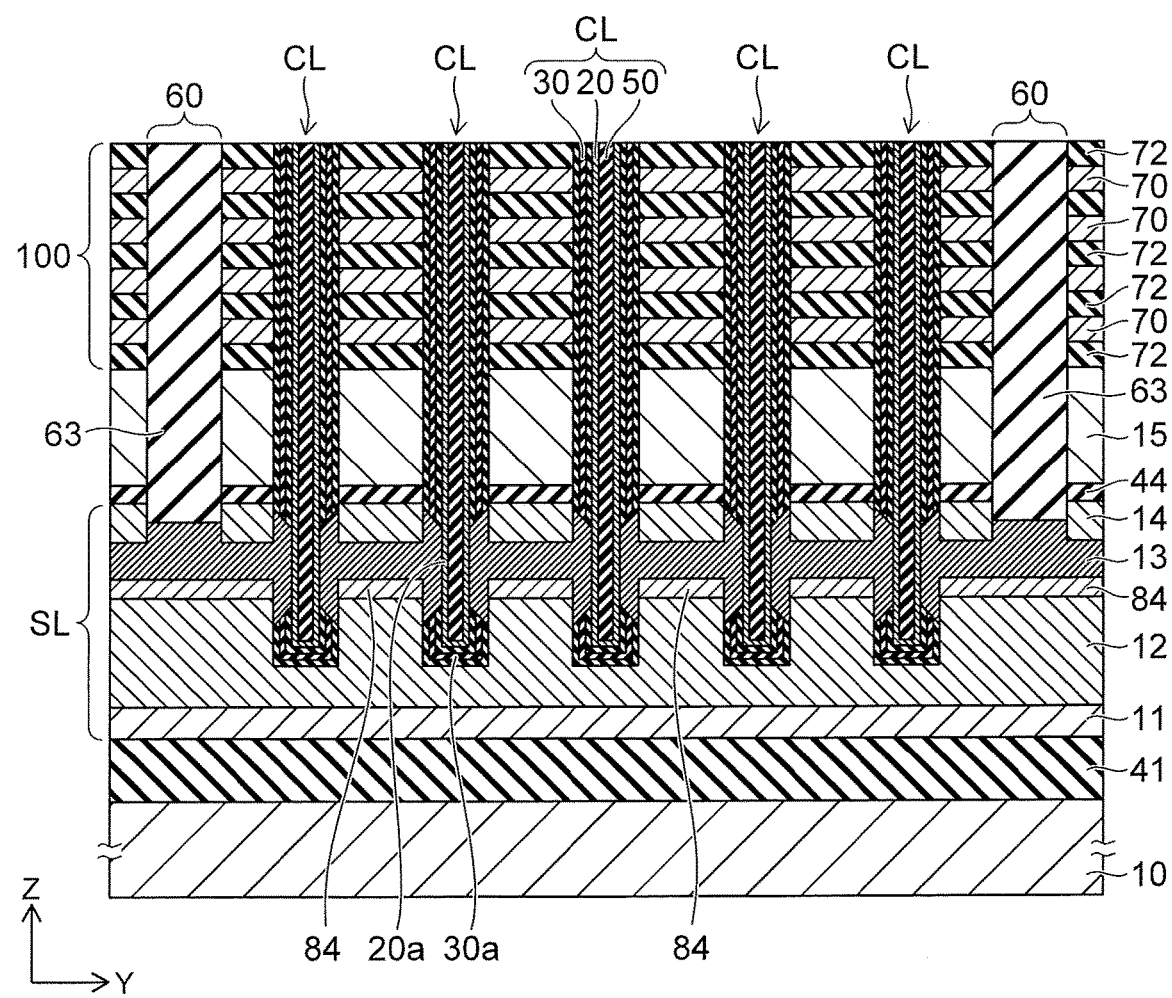
FIG. 18 is a schematic cross-sectional view of a semiconductor device of a second embodiment.

FIG. 18 is a schematic cross-sectional view of a semiconductor device of a second embodiment. FIG. 18 corresponds to an A-A' cross-sectional view of FIG. 2.

According to the semiconductor device of the second embodiment, a crystal separation layer is provided between the silicon layer 12 and the silicon layer 13.

As the crystal separation layer in the example shown in FIG. 18, a polycrystalline silicon layer 84 that includes silicon as a major component and further includes at least one of carbon, nitrogen, or oxygen is provided. The thickness of the silicon layer 84 is thinner than the thickness of the silicon layer 12.

As described above, the silicon layer 13 is filled into the gap 90 formed between the silicon layer 12 and the silicon layer 14. The silicon layer 13 is grown from the surface of the silicon material exposed in the air gap 90.

Figure 21:
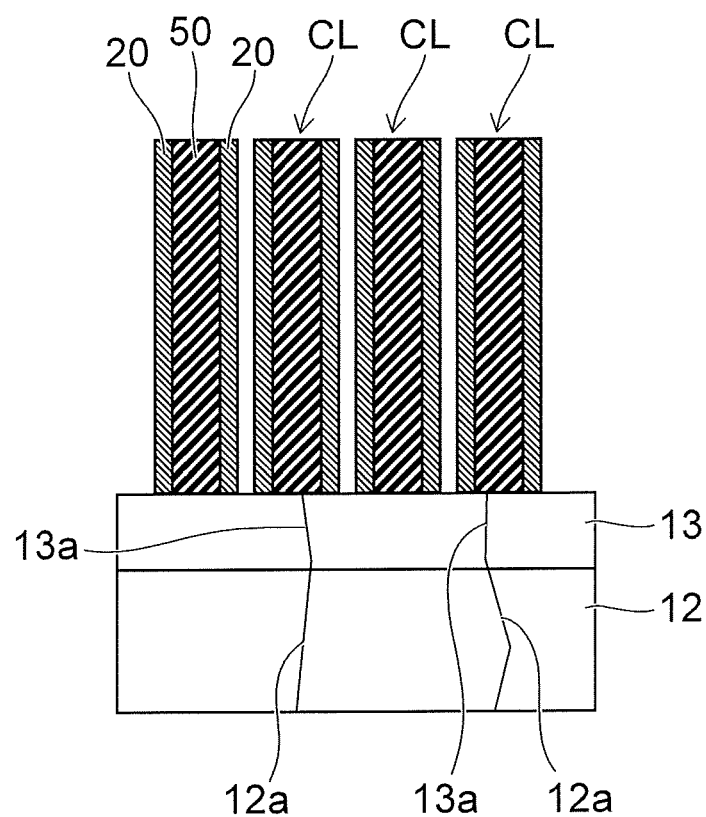
FIG. 21 is a schematic cross-sectional view of a semiconductor device of a comparative example.

FIG. 21 is a schematic cross-sectional view of the case where the silicon layer 13 is grown on the silicon layer 12.

FIG. 21 schematically illustrates the arrangement layout of the multiple semiconductor bodies 20 in the planar direction of the silicon layer 13.

FIG. 21 also schematically illustrates grain boundaries 12a of the crystal of the silicon layer 12 and grain boundaries 13a of the crystal of the silicon layer 13.

The silicon layer 13 is grown by inheriting the crystallinity of the silicon layer 12 of the foundation. Accordingly, the grain size (or the grain diameter) of the crystal of the silicon layer 13 is about the same as the grain size (or the grain diameter) of the silicon layer 12; and the grain boundary density of the crystal of the silicon layer 13 is about the same as the grain boundary density of the silicon layer 12.

The phosphorus that is doped into the silicon layer 12 diffuses into the semiconductor bodies 20 mainly via the grain boundaries 12a of the silicon layer 12 and the grain boundaries 13a of the silicon layer 13.

In the case where the grain boundary density of the silicon layer 13 is low compared to the arrangement density of the multiple semiconductor bodies 20, fluctuation of the amount and the upward diffusion distance of the phosphorus that reaches the multiple semiconductor bodies 20 occurs between the semiconductor bodies 20 disposed in the regions where the grain boundaries 13a are sparse and the semiconductor bodies 20 disposed proximally to the grain boundaries 13a. This causes fluctuation of the GIDL current and the cell current between the multiple semiconductor bodies 20.

Figure 19:
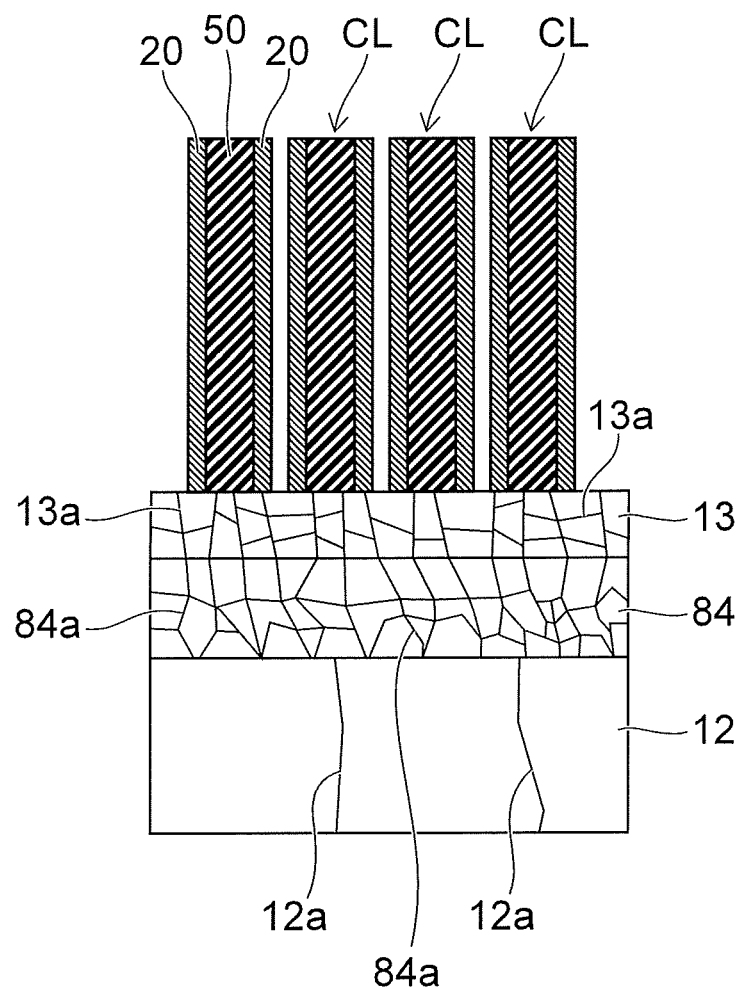
FIG. 19 is a schematic cross-sectional view of a semiconductor device of a second embodiment.

FIG. 19 is a schematic cross-sectional view similar to FIG. in which the silicon layer 84 is formed as the crystal separation layer on the silicon layer 12, and the silicon layer 13 is grown on the silicon layer 84.

FIG. 19 schematically illustrates the grain boundaries 12a of the crystal of the silicon layer 12, grain boundaries 84a of the crystal of the silicon layer 84, and the grain boundaries 13a of the crystal of the silicon layer 13.

The silicon layer 84 that includes at least one of carbon, nitrogen, or oxygen does not inherit the crystallinity of the silicon layer 12; the grain size (or the grain diameter) of the crystal of the silicon layer 84 is smaller than the grain size (or the grain diameter) of the silicon layer 12; and the grain boundary density of the crystal of the silicon layer 84 is higher than the grain boundary density of the silicon layer 12.

The silicon layer 13 grows on the silicon layer 84 by inheriting the crystallinity of the silicon layer 84; the grain size (or the grain diameter) of the crystal of the silicon layer 13 is about the same as the grain size (or the grain diameter) of the crystal of the silicon layer 84; and the grain boundary density of the crystal of the silicon layer 13 is about the same as the grain boundary density of the crystal of the silicon layer 84. Accordingly, the grain size (or the grain diameter) of the crystal of the silicon layer 13 is smaller than the grain size (or the grain diameter) of the crystal of the silicon layer 12; and the grain boundary density of the crystal of the silicon layer 13 is higher than the grain boundary density of the crystal of the silicon layer 12.

By increasing the grain boundary density of the silicon layer 13, the grain boundaries 13a which are the diffusion path of the phosphorus can be distributed uniformly for the multiple semiconductor bodies 20. This reduces fluctuation of the amount and the upward diffusion distance of the phosphorus that reaches the multiple semiconductor bodies 20 and reduces fluctuation of the GIDL current and the cell current between the multiple semiconductor bodies 20.

When forming the silicon layer 84 by CVD, for example, the silicon layer 84 that includes nitrogen can be formed by adding $N_2O$ gas to the source gas of silicon. The nitrogen concentration in the silicon layer 84 can be controlled by the flow rate of the $N_2O$ gas.

As the nitrogen concentration in the silicon layer 84 increases, the crystal grain size of the silicon layer 84 decreases; and the crystal grain boundary density inside the silicon layer 84 increases. According to knowledge obtained by the inventors, in the case where the spacing between the multiple columnar portions CL is about 100 to 200 nm, it is desirable for the nitrogen concentration in the silicon layer 84 to be $1 \times 10^{19}$ cm$^{-3}$ or more to cause the amount and the diffusion distance of the phosphorus to be uniform between the multiple semiconductor bodies 20.

When forming the silicon layer 84 by CVD, for example, the silicon layer 84 that includes oxygen can be formed by adding NO gas to the source gas of silicon. The oxygen concentration in the silicon layer 84 can be controlled by the flow rate of the NO gas.

As the oxygen concentration in the silicon layer 84 increases, the crystal grain size of the silicon layer 84 decreases; and the crystal grain boundary density inside the silicon layer 84 increases. According to knowledge obtained by the inventors, in the case where the spacing between the multiple columnar portions CL is about 100 to 200 nm, it is desirable for the oxygen concentration in the silicon layer 84 to be $1 \times 10^{19}$ cm$^{-3}$ or more to cause the amount and the diffusion distance of the phosphorus to be uniform between the multiple semiconductor bodies 20.

When forming the silicon layer 84 by CVD, for example, the silicon layer 84 that includes carbon can be formed by adding $C_2H_4$ gas to the source gas of silicon. The carbon concentration in the silicon layer 84 can be controlled by the flow rate of the $C_2H_4$ gas.

As the carbon concentration in the silicon layer 84 increases, the crystal grain size of the silicon layer 84 decreases; and the crystal grain boundary density inside the silicon layer 84 increases. According to knowledge obtained by the inventors, in the case where the spacing between the multiple columnar portions CL is about 100 to 200 nm, it is desirable for the carbon concentration in the silicon layer 84 to be $1 \times 10^{19}$ cm$^{-3}$ or more to cause the amount and the diffusion distance of the phosphorus to be uniform between the multiple semiconductor bodies 20.

Figure 20:
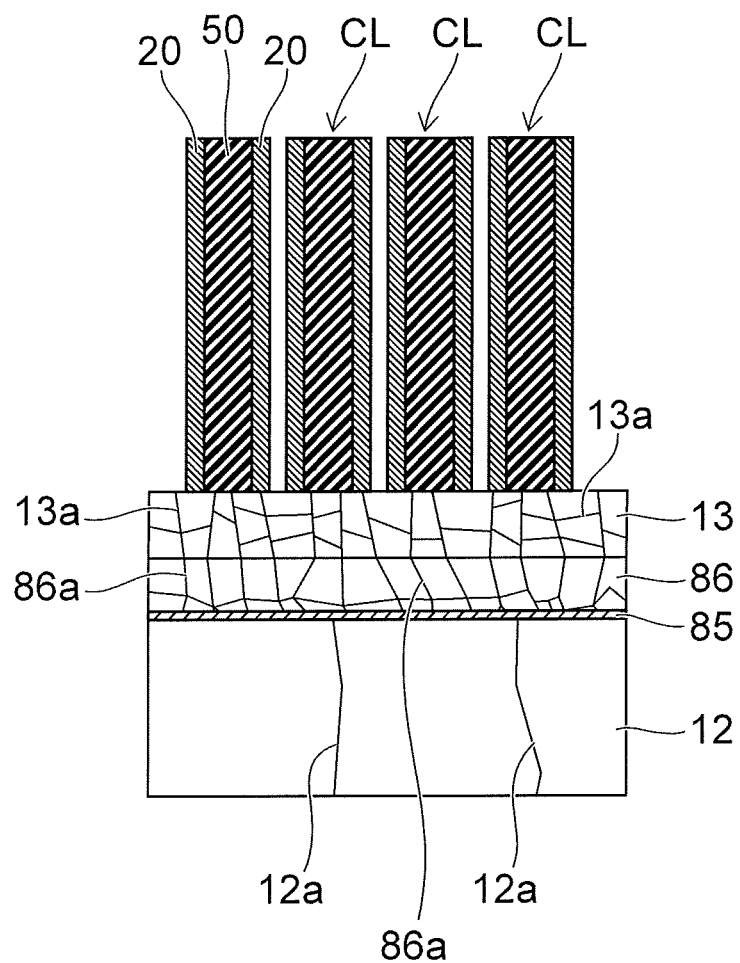
FIG. 20 is a schematic cross-sectional view of a semiconductor device of a second embodiment.

FIG. 20 is a schematic cross-sectional view similar to FIG. 19 in which an oxygen layer (an O-layer) 85 is formed as the crystal separation layer on the silicon layer 12.

A silicon layer 86 is grown on the oxygen layer 85; and the silicon layer 13 is grown on the silicon layer 86.

FIG. 20 schematically illustrates the grain boundaries 12a of the crystal of the silicon layer 12, grain boundaries 86a of the crystal of the silicon layer 86, and the grain boundaries 13a of the crystal of the silicon layer 13.

The oxygen layer 85 is formed by adsorbing oxygen atoms on the surface of the silicon layer 12 and has a thickness of, for example, about one oxygen atom.

The thickness of the silicon layer 86 is thinner than the thickness of the silicon layer 12; and the thickness of the silicon layer 13 is thinner than the thickness of the silicon layer 12. The oxygen layer 85 is thinner than the thickness of the silicon layer 86 and thinner than the thickness of the silicon layer 13.

Separation from the crystallinity of the silicon layer 12 is performed by the oxygen layer 85; and the silicon layer 86 is grown on the oxygen layer 85 without inheriting the crystallinity of the silicon layer 12. By setting the thickness of the silicon layer 86 to be thinner than the thickness of the silicon layer 12, the grain size (or the grain diameter) of the crystal of the silicon layer 86 can be set to be smaller than the grain size (or the grain diameter) of the silicon layer 12; and the grain boundary density of the crystal of the silicon layer 86 can be set to be higher than the grain boundary density of the silicon layer 12.

The silicon layer 13 is grown on the silicon layer 86 by inheriting the crystallinity of the silicon layer 86; the grain size (or the grain diameter) of the crystal of the silicon layer 13 is about the same as the grain size (or the grain diameter) of the crystal of the silicon layer 86; and the grain boundary density of the crystal of the silicon layer 13 is about the same as the grain boundary density of the crystal of the silicon layer 86. Accordingly, the grain size (or the grain diameter) of the crystal of the silicon layer 13 is smaller than the grain size (or the grain diameter) of the crystal of the silicon layer 12; and the grain boundary density of the crystal of the silicon layer 13 is higher than the grain boundary density of the crystal of the silicon layer 12.

By increasing the grain boundary density of the silicon layer 13, the grain boundaries 13a which are the diffusion path of the phosphorus can be distributed uniformly for the multiple semiconductor bodies 20. This reduces the fluctuation of the amount and the upward diffusion distance of the phosphorus that reaches the multiple semiconductor bodies 20 and reduces the fluctuation of the GIDL current and the cell current between the multiple semiconductor bodies 20.

According to knowledge obtained by the inventors, in the case where the spacing between the multiple columnar portions CL is about 100 to 200 nm, it is desirable to form the oxygen layer 85 so that the interface oxygen concentration between the oxygen layer 85 and the silicon layer 12 is $1 \times 10^{14}$ cm$^{-2}$ or more to cause the amount and the diffusion distance of the phosphorus to be uniform between the multiple semiconductor bodies 20.

Figure 22:
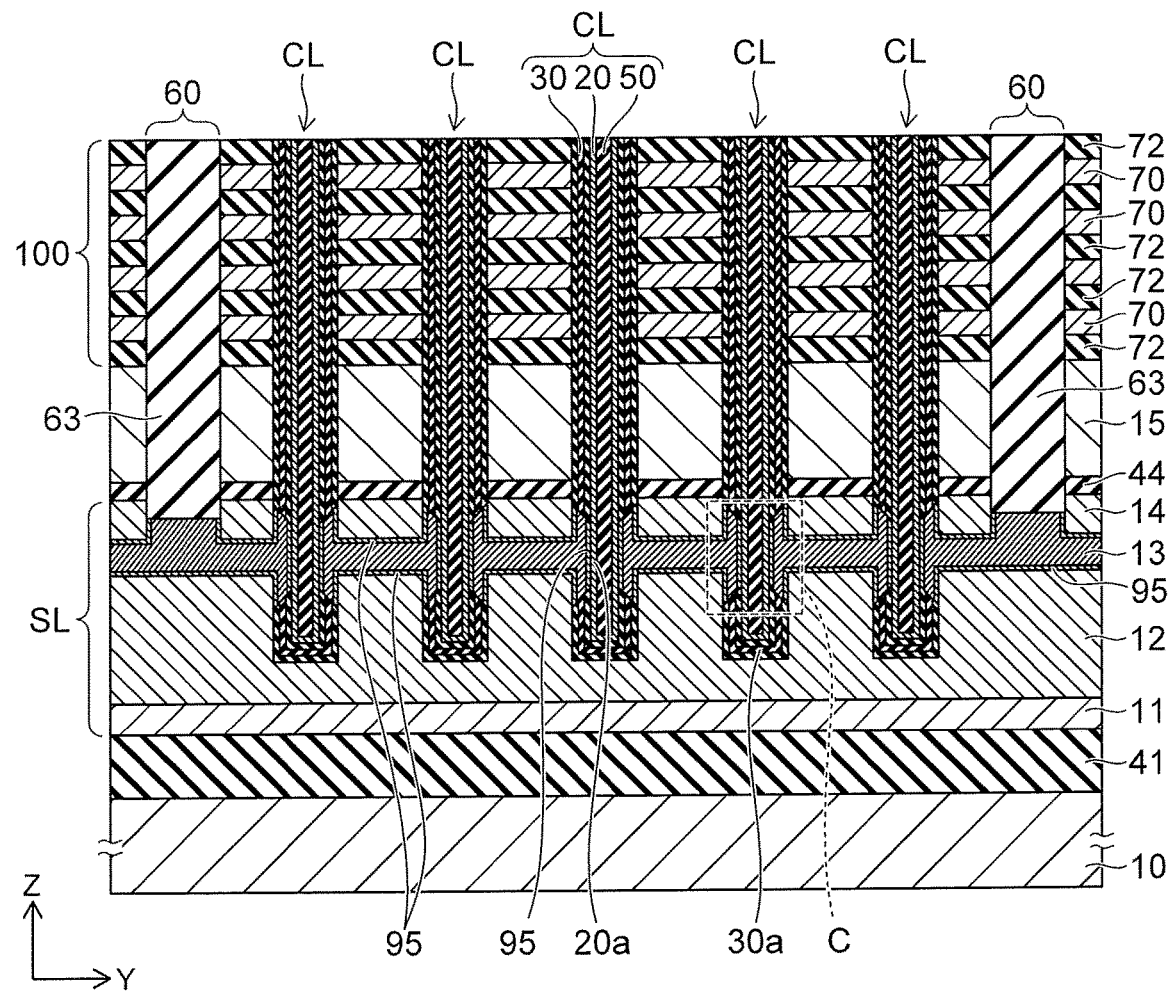
FIG. 22 is a schematic cross-sectional view of a semiconductor device of a third embodiment.

FIG. 22 is a schematic cross-sectional view of a semiconductor device of a third embodiment. FIG. 22 corresponds to an A-A' cross-sectional view of FIG. 2.

Figure 23A:
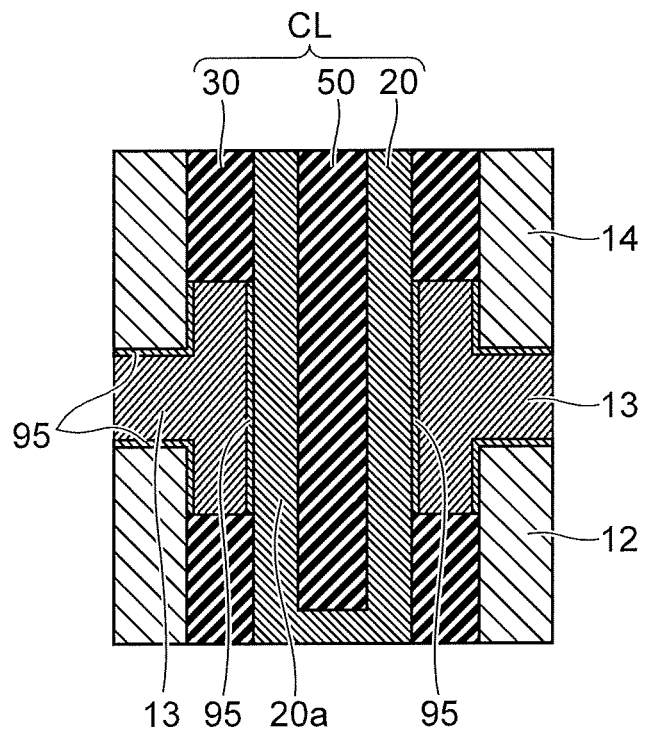
FIGS. 23A and 23B are enlarged views of portion C of FIG. 22.

FIG. 23A is an enlarged view of portion C of FIG. 22.

According to the third embodiment, the phosphorus concentration in the silicon layer 13 is $1 \times 10^{20}$ cm$^{-3}$ or more. By filling the silicon layer 13 having such a phosphorus concentration into the air gap 90, the voids do not move easily even in the case where voids are undesirably formed inside the silicon layer 13. Thereby, good electrical contact between the semiconductor bodies 20 and the source layer SL is maintained.

According to the third embodiment, a silicon film 95 that includes silicon as a major component and further includes carbon also is provided between the silicon layer 13 and the sidewall portion 20a of the semiconductor body 20. The silicon film 95 contacts the sidewall portion 20a of the semiconductor body 20.

The silicon film 95 is provided also between the silicon layer 12 and the silicon layer 13 and between the silicon layer 13 and the silicon layer 14.

For example, when filling the silicon layer 13 into the gap 90, phosphorus diffuses from the silicon layers 12 and 13 into the semiconductor body 20 via the silicon film 95 due to the high-temperature annealing. At this time, the carbon-doped silicon film 95 suppresses the excessive diffusion of phosphorus into the semiconductor body 20.

The appropriate characteristics (the threshold voltage, etc.) of the source-side selection transistor STS and the memory cells MC are set by the appropriate control of the diffusion amount and the diffusion distance of the phosphorus into the semiconductor body 20.

By appropriately adjusting the carbon concentration in the silicon film 95 and the film thickness of the silicon film 95, the excessive diffusion of the phosphorus into the semiconductor body 20 can be suppressed.

Figure 23B:
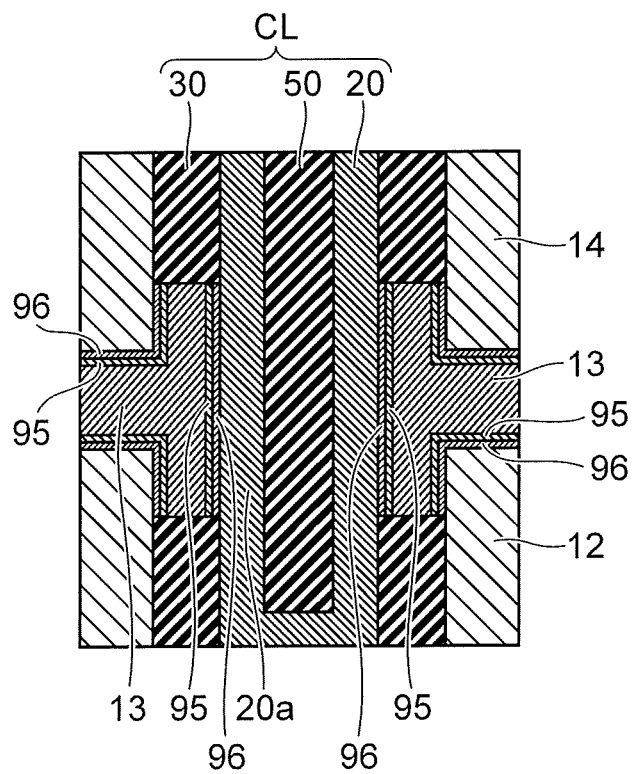

FIG. 23B is a schematic cross-sectional view of a portion similar to FIG. 23A.

According to the example shown in FIG. 23A, a silicon film 96 is provided between the silicon film 95 and the sidewall portion 20a of the semiconductor body 20. The silicon film 96 contacts the sidewall portion 20a of the semiconductor body 20.

The silicon film 95 is provided also between the silicon layer 12 and the silicon layer 13 and between the silicon layer 13 and the silicon layer 14.

The silicon film 96 is, for example, an undoped silicon film 96; and the carbon concentration in the silicon film 96 is lower than the carbon concentration in the carbon-doped silicon film 95.

The undoped silicon film 96 is formed conformally on the inner wall of the air gap 90. The silicon film 96 does not fill the air gap 90. Then, the silicon film 95 is formed on the surface of the silicon film 96 exposed in the air gap 90. The silicon film 95 is formed conformally along the surface of the silicon film 96. Subsequently, the silicon layer 13 is filled into the remaining air gap 90.

The phosphorus diffuses from the silicon layers 12 and 13 into the semiconductor body 20 via the silicon film 95 and the silicon film 96. The carbon-doped silicon film 95 suppresses the excessive diffusion of the phosphorus into the semiconductor body 20.

Further, the film thickness between the silicon layer 13 and the sidewall portion 20a increases by the amount of the silicon film 96 provided between the silicon film 95 and the sidewall portion 20a of the semiconductor body 20; and this film thickness increase also suppresses the excessive diffusion of the phosphorus into the semiconductor body 20.

Although a silicon nitride layer is illustrated as the first layer 71 in the embodiment described above, a metal layer or a silicon layer that is doped with a dopant may be used as the first layer 71. In such a case, the first layer 71 is used to form the electrode layer 70 as-is; therefore, the process of replacing the first layer 71 with the electrode layer is unnecessary.

The second layer 72 may be removed by etching via the slits ST; and the region between the electrode layers 70 adjacent to each other above and below may be a gap.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a silicon layer including phosphorus;
   a buried layer provided on the silicon layer;
   a stacked body provided on the buried layer, the stacked body including a plurality of electrode layers stacked with an insulator interposed;
   a semiconductor body extending in a stacking direction of the stacked body through the stacked body and through the buried layer, and including a sidewall portion positioned at a side of the buried layer; and
   a silicon film provided between the buried layer and the sidewall portion of the semiconductor body, the silicon film including silicon as a major component and further including at least one of germanium or carbon, wherein a germanium composition ratio inside the silicon film is 5 atomic % or more.

2. The device according to claim 1, wherein a carbon concentration in the silicon film is $1\times10^{19}$ cm$^{-3}$ or more.

3. The device according to claim 1, wherein the silicon film further includes phosphorus.

4. The device according to claim 3, wherein a phosphorus concentration in the silicon film is $1\times10^{20}$ cm$^{-3}$ or more.

5. The device according to claim 1, wherein the silicon film contacts the sidewall portion of the semiconductor body.

6. The device according to claim 1, wherein the silicon film is provided also between the silicon layer and the buried layer.

7. The device according to claim 1, wherein the buried layer is a silicon layer or a silicon oxide layer.

8. A semiconductor device, comprising:
a first silicon layer including phosphorus;
a second silicon layer including phosphorus and being provided on the first silicon layer;
a crystal separation layer provided between the first silicon layer and the second silicon layer;
a stacked body provided on the second silicon layer, the stacked body including a plurality of electrode layers stacked with an insulator interposed; and
a semiconductor body extending in a stacking direction of the stacked body through the stacked body and through the second silicon layer, and including a sidewall portion positioned at a side of the second silicon layer.

9. The device according to claim 8, wherein the crystal separation layer is a silicon layer including silicon as a major component and further including at least one of carbon, nitrogen, or oxygen.

10. The device according to claim 9, wherein at least one of a carbon concentration, a nitrogen concentration, or an oxygen concentration in the silicon layer is $1\times10^{19}$ cm$^{-3}$ or more.

11. The device according to claim 8, wherein the crystal separation layer is an oxygen layer.

12. The device according to claim 11, wherein an interface oxygen concentration of the oxygen layer is $1\times10^{14}$ cm$^{-2}$ or more.

13. The device according to claim 8, wherein a crystal grain boundary density inside the second silicon layer is higher than a crystal grain boundary density inside the first silicon layer.

14. The device according to claim 8, wherein a thickness of the second silicon layer is thinner than a thickness of the first silicon layer.

15. A semiconductor device, comprising:
a first silicon layer including phosphorus;
a second silicon layer including phosphorus and being provided on the first silicon layer, a phosphorus concentration of the second silicon layer being $1\times10^{20}$ cm$^{-3}$ or more;
a stacked body provided on the second silicon layer, the stacked body including a plurality of electrode layers stacked with an insulator interposed;
a semiconductor body extending in a stacking direction of the stacked body through the stacked body and through the second silicon layer, and including a sidewall portion positioned at a side of the second silicon layer;
a first silicon film provided between the second silicon layer and the sidewall portion of the semiconductor body, the first silicon film including silicon as a major component and further including carbon, and
a second silicon film provided between the first silicon film and the sidewall portion of the semiconductor body, a carbon concentration of the second silicon film being lower than a carbon concentration of the first silicon film.

16. The device according to claim 15, wherein the first silicon film is provided also between the first silicon layer and the second silicon layer.

* * * * *